(12) United States Patent
Sakaguchi

(10) Patent No.: US 6,946,354 B2
(45) Date of Patent: Sep. 20, 2005

(54) SUBSTRATE AND MANUFACTURING METHOD THEREFOR

(75) Inventor: Kiyofumi Sakaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 26 days.

(21) Appl. No.: 10/654,008

(22) Filed: Sep. 4, 2003

(65) Prior Publication Data

US 2004/0048454 A1 Mar. 11, 2004

(30) Foreign Application Priority Data

Sep. 10, 2002 (JP) ........................................ 2002-264188

(51) Int. Cl.⁷ ........................................... H01L 21/336
(52) U.S. Cl. ...................... 438/305; 438/528; 438/907
(58) Field of Search ................... 438/162, 305, 438/406, 407, 413, 458, 459, 528, 907

(56) References Cited

U.S. PATENT DOCUMENTS

| | | | |
|---|---|---|---|
| 3,372,063 A | 3/1968 | Suzuki et al. ............... | 438/413 |
| 4,498,951 A | 2/1985 | Tamura et al. ................ | 117/43 |
| 4,549,926 A | 10/1985 | Corboy, Jr. et al. ......... | 438/412 |
| 4,585,493 A | 4/1986 | Anthony ...................... | 117/42 |
| 4,725,561 A | 2/1988 | Haond et al. ............... | 438/404 |
| 4,851,078 A | 7/1989 | Short et al. .................. | 438/406 |
| 4,874,718 A | 10/1989 | Inoue .......................... | 438/481 |
| 4,952,526 A | 8/1990 | Pribat et al. ................ | 438/412 |
| 4,963,505 A | 10/1990 | Fujii et al. ..................... | 437/62 |
| 5,084,419 A | 1/1992 | Sakao ......................... | 438/400 |
| 5,086,011 A | 2/1992 | Shiota ......................... | 438/406 |
| 5,138,422 A | 8/1992 | Fujii et al. .................... | 357/49 |
| 5,298,449 A | 3/1994 | Kikuchi ....................... | 437/63 |
| 5,371,037 A | 12/1994 | Yonehara ..................... | 437/86 |
| 5,374,564 A | 12/1994 | Bruel .......................... | 437/24 |
| 5,397,735 A | 3/1995 | Marcandalli et al. ........ | 438/459 |
| 5,402,989 A | 4/1995 | Takasu ........................ | 257/506 |

(Continued)

FOREIGN PATENT DOCUMENTS

| | | |
|---|---|---|
| EP | 1 100 124 A1 | 5/2001 |
| FR | 2774511 | 8/1999 |
| JP | 1-144665 | 6/1989 |
| JP | 11-17001 | 1/1999 |
| JP | 2001-320033 | 11/2001 |
| TW | 437078 | 5/2001 |

Primary Examiner—Phuc T. Dang
(74) Attorney, Agent, or Firm—Fitzpatrick, Cella, Harper & Scinto

(57) ABSTRACT

There is provided a method of manufacturing a substrate which has a partial insulating layer under a semiconductor layer. After the first substrate (10c) is formed, it is bonded to the second substrate (20), thereby forming a bonded substrate stack (30). Then, the bonded substrate stack (30) is split at a separation layer (15). In the step of forming the first substrate (10c), a partial insulating layer (12a) is formed on the substrate, a single-crystal Si layer (13) is grown in the partial insulating layer (12a), and a polysilicon layer (14) is grown on the partial insulating layer (12a). After that, ions are implanted into the substrate, thereby forming the separation layer (15) inside the substrate.

19 Claims, 16 Drawing Sheets

U.S. PATENT DOCUMENTS

| | | | |
|---|---|---|---|
| 5,403,771 A | 4/1995 | Nishida et al. | 438/97 |
| 5,854,123 A | 12/1998 | Sato et al. | 437/507 |
| 5,856,229 A | 1/1999 | Sakaguchi et al. | 438/406 |
| 5,894,152 A | 4/1999 | Jaso et al. | 257/347 |
| 5,945,703 A | 8/1999 | Furukawa et al. | 257/301 |
| 5,966,620 A | 10/1999 | Sakaguchi et al. | 438/455 |
| 5,994,207 A | 11/1999 | Henley et al. | 438/515 |
| 6,054,363 A | 4/2000 | Sakaguchi et al. | 438/406 |
| 6,100,165 A | 8/2000 | Sakaguchi et al. | 438/455 |
| 6,100,166 A | 8/2000 | Sakaguchi et al. | 438/455 |
| 6,103,598 A | 8/2000 | Yamagata et al. | 438/459 |
| 6,121,112 A | 9/2000 | Sakaguchi et al. | 438/406 |
| 6,136,684 A | 10/2000 | Sato et al. | 438/624 |
| 6,191,007 B1 * | 2/2001 | Matsui et al. | 438/459 |
| 6,246,068 B1 | 6/2001 | Sato et al. | 257/3 |
| 6,294,478 B1 | 9/2001 | Sakaguchi et al. | 438/753 |
| 6,323,108 B1 * | 11/2001 | Kub et al. | 438/458 |
| 6,342,433 B1 | 1/2002 | Ohmi et al. | 438/455 |
| 6,350,702 B2 | 2/2002 | Sakaguchi et al. | 438/753 |
| 6,382,292 B1 | 5/2002 | Ohmi et al. | 156/584 |
| 6,562,692 B1 | 5/2003 | Oi | 438/406 |
| 6,602,767 B2 | 8/2003 | Nishida et al. | 438/507 |
| 6,605,518 B1 | 8/2003 | Ohmi et al. | 438/458 |
| 6,617,668 B1 | 9/2003 | Koide et al. | 257/615 |
| 2001/0025991 A1 | 10/2001 | Kim | 257/347 |
| 2004/0033674 A1 | 2/2004 | Todd | 438/478 |
| 2004/0058511 A1 | 3/2004 | Sakaguchi | 438/458 |

* cited by examiner

SUBSTRATE AND MANUFACTURING METHOD THEREFOR

FIELD OF THE INVENTION

The present invention relates to a substrate and manufacturing method therefor and, more particularly, to a substrate having a partial insulating layer inside and a manufacturing method therefor.

BACKGROUND OF THE INVENTION

In recent years, a substrate which has a semiconductor layer on an insulating layer has received attention. This substrate is referred to as a Semiconductor-On-Insulator substrate or Silicon-On-Insulator substrate. The latter substrate is one of Semiconductor-On-Insulator substrates and has a semiconductor layer made of silicon. Both Semiconductor-On-Insulator substrates and Silicon-On-Insulator substrates are called SOI substrates.

As an SOI substrate, a substrate which has an insulating layer not in the entire region but in a partial region under a semiconductor layer or an Si layer has been proposed. A related art is disclosed in Japanese Patent No. 2794702 (semiconductor device manufacturing method). A manufacturing method disclosed in Japanese Patent No. 2794702 forms an $n^+$-layer on an $n^-$-silicon substrate serving as the first substrate, forms a thermal oxide film ($SiO_2$) on the $n^+$-layer, and then removes an unnecessary portion of the thermal oxide film. With this operation, the thermal oxide film is partially left on the $n^+$-layer. After that, an epitaxial layer is grown on an exposed portion of the $n^+$-layer. At this time, a polysilicon layer is formed on the partial thermal oxide film. The main surface of the first substrate is polished such that the epitaxial and polysilicon layers have the same height. Then, the main surface side of the first substrate is bonded to the second substrate, thereby obtaining a final substrate. This final substrate has a partial buried insulating layer (thermal oxide film) under a portion constituted by the first substrate. A semiconductor device is formed on the portion constituted by the first substrate.

In the manufacturing method disclosed in Japanese Patent No. 2794702, a portion on which a device is to be formed is the first substrate itself in a final substrate to be manufactured, and the thickness is very large. For this reason, it is difficult for the final substrate to enjoy the advantages of a general SOI substrate. More specifically, a substrate obtained by the manufacturing method disclosed in Japanese Patent No. 2794702 cannot sufficiently exhibit the advantages of an SOI substrate, such as low power consumption, high-speed operation, and the like.

The manufacturing method disclosed in Japanese Patent No. 2794702 polishes the first substrate, in which the epitaxial layer and polysilicon layer are combined on the surface, before bonding the first and second substrates. However, there is a limit to planarization of the surface of the first substrate by the polishing step. More specifically, if the polishing conditions are set for the epitaxial layer, the planarity of the polysilicon layer becomes poor. On the other hand, if the polishing conditions are set for the polysilicon layer, the planarity of the epitaxial layer becomes poor. Additionally, a level difference may occur between the epitaxial layer and the polysilicon layer.

If the first substrate in which the epitaxial layer and polysilicon layer are combined on the surface has poor surface planarity, poor bonding is likely to occur in bonding the first substrate to the second substrate. This poor bonding interferes with the formation of a high-quality device.

SUMMARY OF THE INVENTION

The present invention has been made on the basis of the above consideration. It is an object of the present invention to ensure the advantages of an SOI substrate for a substrate having a partial insulating layer under a semiconductor layer.

It is another object of the present invention to improve the quality of a substrate manufactured through a step of bonding two substrates.

According to the present invention, there is provided a substrate manufacturing method comprising a step of forming a first substrate which has a partial insulating layer on a semiconductor region and a semiconductor layer on a region surrounded by the partial insulating layer and on the partial insulating layer, a step of implanting ions into the first substrate through a surface of the first substrate to form a separation layer at a position deeper than a position of the partial insulating layer, a step of bonding a second substrate to the surface of the first substrate, in which the separation layer is formed, to form a bonded substrate stack, and a step of splitting the bonded substrate stack at the separation layer.

According to a preferred embodiment of the present invention, the method preferably further comprises a step of planarizing the surface of the first substrate before bonding the second substrate to the first substrate.

According to a preferred embodiment of the present invention, preferably, in the step of forming the first substrate, a single-crystal semiconductor layer is formed on the region surrounded by the partial insulating layer, and a non-single-crystal semiconductor layer is formed on the partial insulating layer.

According to a preferred embodiment of the present invention, the semiconductor region preferably comprises a semiconductor layer formed on the substrate by epitaxial growth.

According to a preferred embodiment of the present invention, at least a surface, to be bonded to the first substrate, of the second substrate preferably comprises an insulator.

According to a preferred embodiment of the present invention, the method preferably further comprises a step of forming a bonding layer to be bonded to the second substrate across the surface of the first substrate.

According to a preferred embodiment of the present invention, the method preferably further comprises a step of planarizing a surface of the bonding layer after the step of forming the bonding layer and before the step of forming the bonded substrate stack.

According to a preferred embodiment of the present invention, the method preferably further comprises a step of planarizing the surface of the first substrate after the step of forming the first substrate and before the step of forming the bonding layer.

According to a preferred embodiment of the present invention, in the step of forming the bonding layer, a layer having a substantially uniform structure across a surface of the layer is preferably formed as the bonding layer.

According to a preferred embodiment of the present invention, in the step of forming the bonding layer, e.g., a polycrystalline semiconductor layer, an amorphous semiconductor layer, or an insulating layer is preferably formed as the bonding layer. If an insulating layer is formed as the bonding layer, the insulating layer preferably comprises, e.g., an oxide film. The oxide film is preferably formed by, e.g., CVD.

According to a preferred embodiment of the present invention, the step of forming the first substrate preferably includes a first growth step of growing a single-crystal semiconductor layer on the region surrounded by the partial insulating layer under the condition that no layer grow on the partial insulating layer, and a second growth step of further growing a single-crystal semiconductor layer on the single-crystal semiconductor layer and growing a non-single-crystal semiconductor layer on the partial insulating layer. In the first growth step, the single-crystal semiconductor layer is preferably grown to have a thickness larger than a thickness of the partial insulating layer. Alternatively, in the first growth step, the single-crystal semiconductor layer is preferably grown such that the non-single-crystal semiconductor layer to be formed in the subsequent second growth step fits in a region on the partial insulating layer.

According to a preferred embodiment of the present invention, the ions preferably include, e.g., hydrogen ions or helium ions.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

[First Embodiment]

FIGS. 1A to 1I are views for explaining a substrate manufacturing method according to the first embodiment of the present invention. In the step shown in FIG. 1A, a single-crystal Si substrate (seed substrate) 11 is prepared. As the single-crystal Si substrate 11, a substrate having an epitaxial growth layer of single-crystal silicon on its surface may be employed.

Figure 1A:
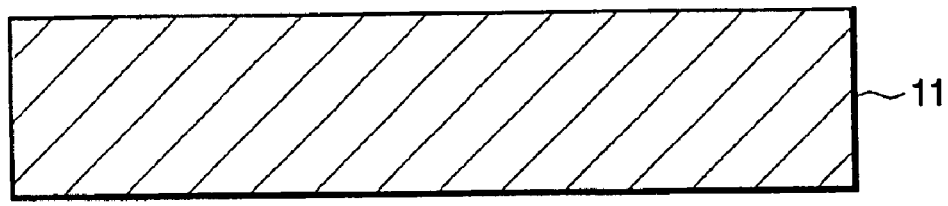
FIGS. 1A to 1I are views for explaining a substrate manufacturing method according to the first embodiment of the present invention.
Figure 1B:
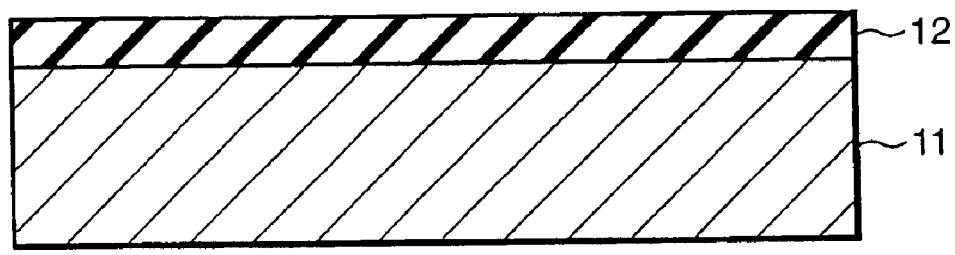

In the step shown in FIG. 1B, an $SiO_2$ layer 12 serving as an insulating layer is formed on the single-crystal Si substrate 11. The $SiO_2$ layer 12 can be formed by, e.g., thermal oxidation. Thermal oxidation can form an $SiO_2$ layer of good quality.

Figure 1C:
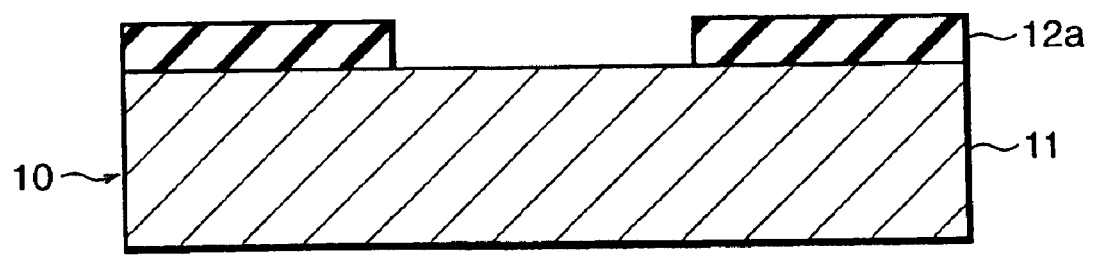

In the step shown in FIG. 1C, the $SiO_2$ layer 12 is patterned to form a partial $SiO_2$ layer 12a. A partial $SiO_2$ layer is defined as an $SiO_2$ layer which is formed such that the single-crystal Si substrate 11 or an underlying semiconductor region (e.g., an epitaxial growth Si layer if a substrate having the Si layer on its surface is adopted as the single-crystal Si substrate 11) is at least partially exposed. The $SiO_2$ layer 12 can be patterned by, e.g., the following operation. After a mask material is formed on the $SiO_2$ layer 12, the mask material is patterned by lithography (resist coating, exposure, development, and etching) to form an opening. The $SiO_2$ layer 12 exposed at the bottom of the opening is then etched by, e.g., reactive ion etching (RIE).

This step forms a first substrate 10 which has the partial $SiO_2$ layer (insulating layer) 12a on the single-crystal Si substrate 11.

Instead of the steps shown in FIGS. 1B and 1C, e.g., a step of covering the surface except a region in which the partial $SiO_2$ layer 12a is to be formed with a mask pattern and forming the partial $SiO_2$ layer 12a only in an exposed portion may be adopted.

Figure 1D:
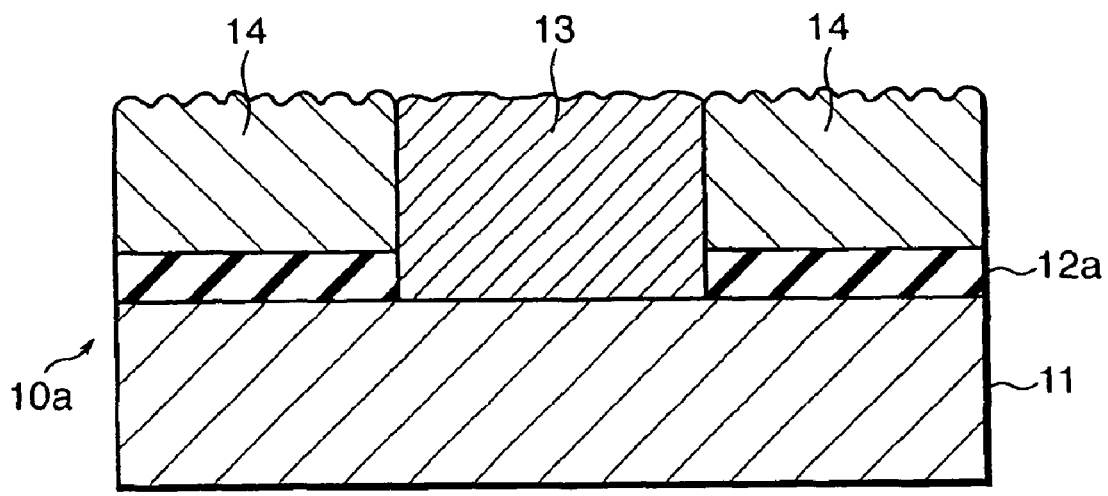

In the step shown in FIG. 1D, a single-crystal Si layer (semiconductor layer) 13 is grown by epitaxial growth on an exposed portion of the single-crystal Si substrate (semiconductor region) 11 in the partial $SiO_2$ layer 12a of the first substrate 10. At this time, a polysilicon layer (non-single-crystal semiconductor layer) 14 may be formed on the partial insulating layer 12a. The single-crystal Si layer 13 may be grown on the single-crystal Si substrate 11 under the condition that the polysilicon layer 14 be not formed on the partial insulating layer 12a.

Typically, the single-crystal Si layer 13 and polysilicon layer 14 are different in growth rate, and a level difference may occur between the single-crystal Si layer 13 and the polysilicon layer 14. Three-dimensional patterns can be formed on the surfaces of the single-crystal Si layer 13 and polysilicon layer 14, respectively.

Figure 1E:
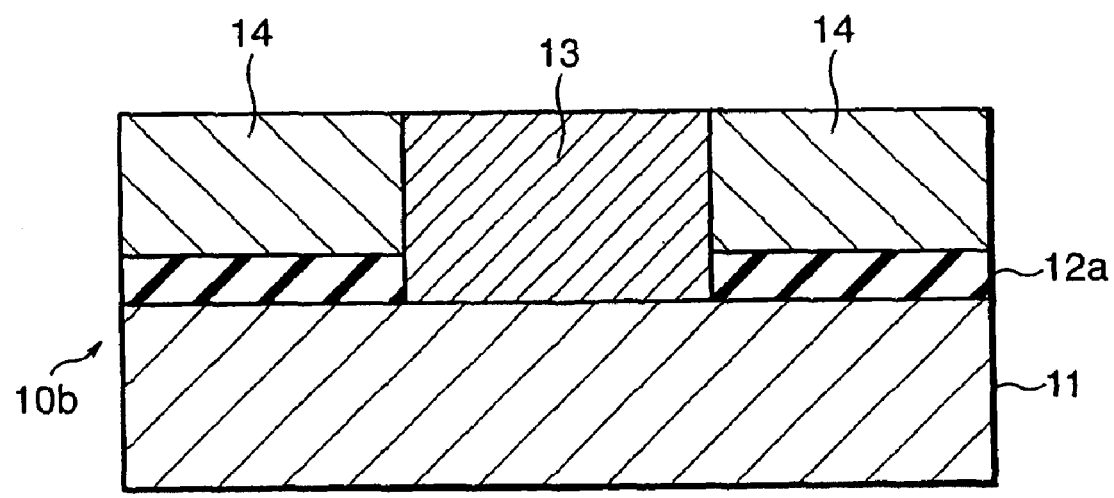

In the step shown in FIG. 1E, the surface of a first substrate 10a shown in FIG. 1D is planarized by polishing, grinding, or the like, thereby forming a first substrate 10b having a flat surface.

Figure 1F:
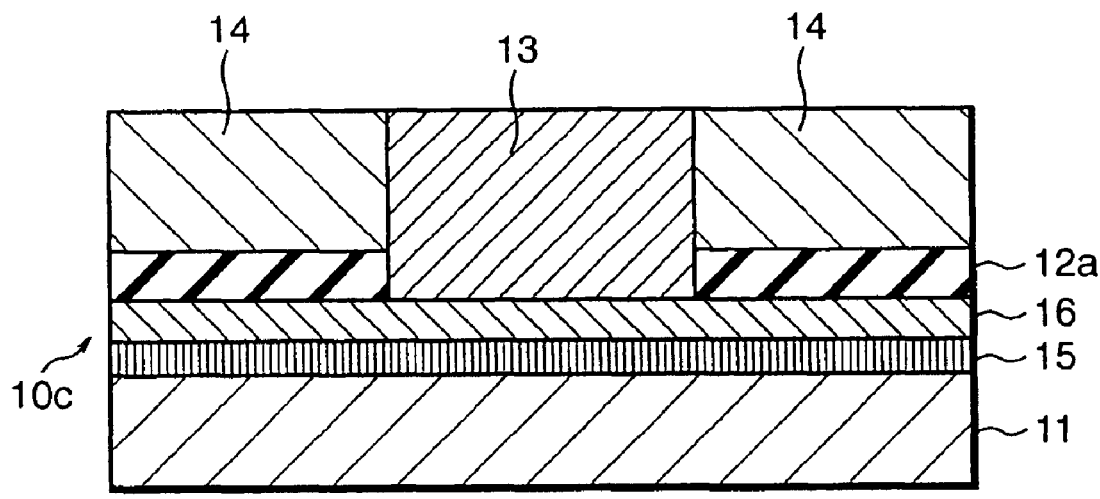

In the step shown in FIG. 1F, ions such as hydrogen ions or helium ions are implanted at a position deeper than that of the partial $SiO_2$ layer (insulating layer) 12a of the first substrate 10b through the surface of the first substrate 10b to form an ion-implanted layer serving as a separation layer 15 at a position spaced apart downward from the lower surface of the partial $SiO_2$ layer 12a and single-crystal Si layer 13. With this operation, under the partial $SiO_2$ layer 12a and single-crystal Si layer 13, the surface portion of the original single-crystal Si substrate 11 is left as a single-crystal Si layer 16, the separation layer 15 is formed under the single-crystal Si layer 16, and the main portion (portion other than the surface portion) of the original single-crystal Si substrate 11 is left as a single-crystal Si portion 11a. This ion implantation step can be performed before the step shown in FIG. 1E.

Figure 1G:
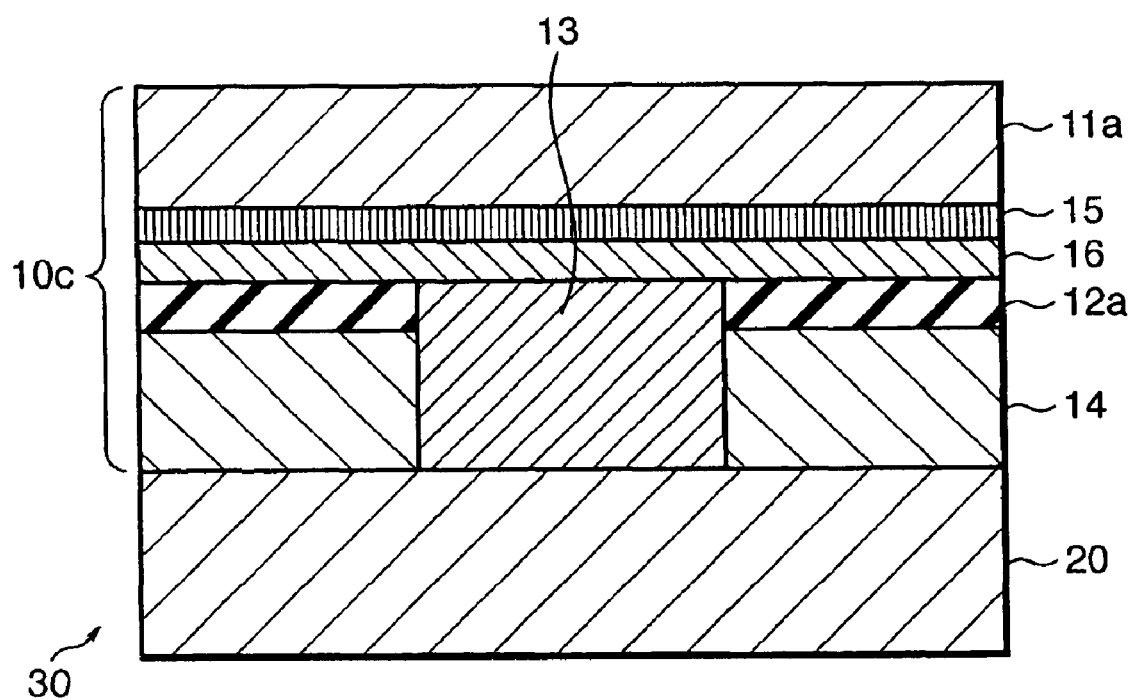

In the step shown in FIG. 1G, a second substrate (handle substrate) 20 is bonded to the surface (a surface in which the single-crystal Si layer 13 and polysilicon layer 14 are exposed) of a first substrate 10c shown in FIG. 1F to form a bonded substrate stack 30. An SiO$_2$ layer (insulating layer) may be formed on the surface of the first substrate 10 by, e.g., thermal oxidation, prior to the bonding. At this time, if a thermal oxidation step at 400° C. or more is necessary, the thermal oxidation step is performed before the ion implantation step. As the second substrate 20, a single-crystal Si substrate or a substrate obtained by forming an insulating layer such as an SiO$_2$ layer on the surface can typically be used. However, any other substrate such as an insulating substrate (e.g., a glass substrate) may be adopted as the second substrate 20.

Figure 1H:
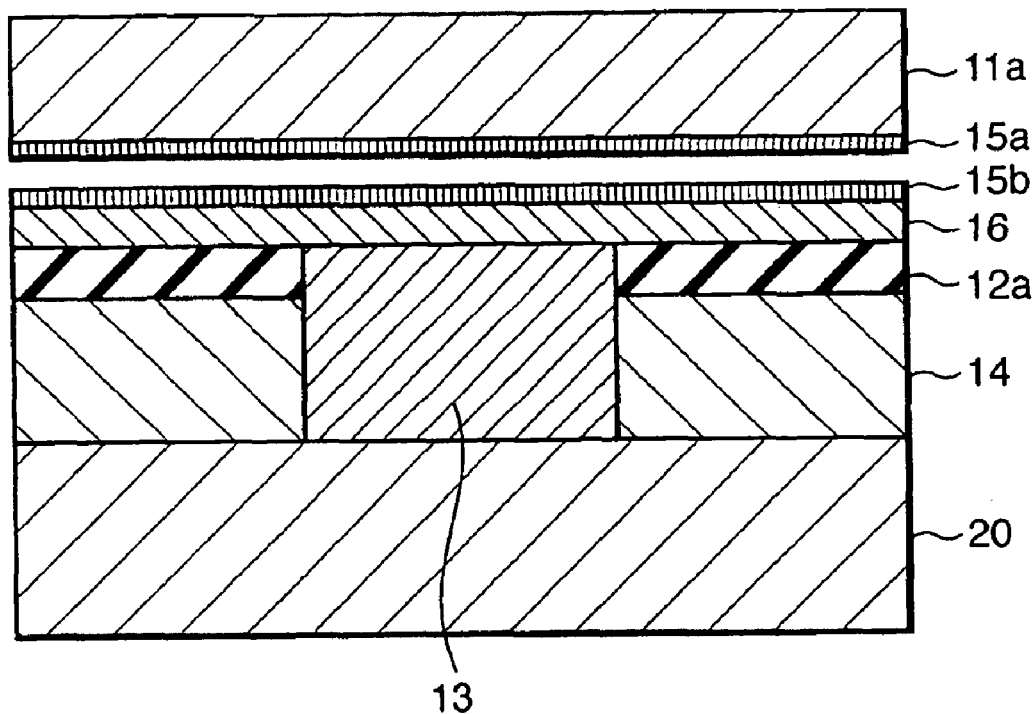

In the step shown in FIG. 1H, the bonded substrate stack 30 is split into two substrates by cutting the bonded substrate stack 30 at the separation layer 15. This splitting may be performed by annealing the bonded substrate stack 30. Alternatively the splitting can be performed by using a fluid. As a method of using a fluid, a method of forming a jet of a fluid (liquid or gas) and injecting it to the separation layer 15, a method of utilizing the static pressure of a fluid, or the like is preferably used. Among these methods, a method of utilizing water as a fluid is referred to as a water jet method. Additionally, the splitting can also be performed by, e.g., inserting a member such as a solid wedge into the separation layer 15.

In addition to the above-mentioned splitting methods, a grinding and polishing method in which the back surface (exposed surface) of the first substrate 10c is ground and polished to leave a single-crystal Si layer with a predetermined thickness on the insulating layer 12a may be adopted. In this case, the separation layer 15 need not be formed in advance.

Figure 1I:
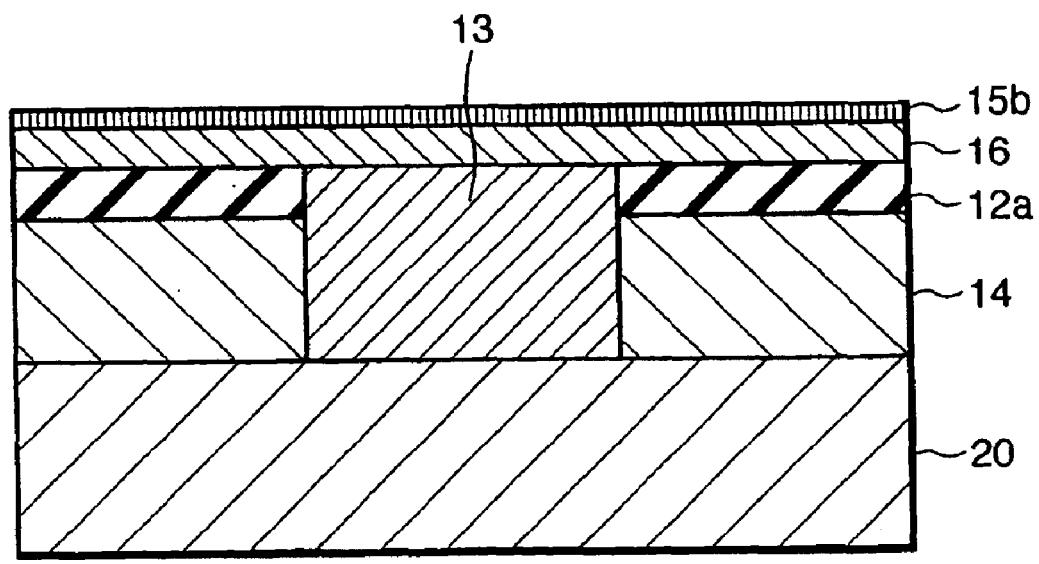

In the step shown in FIG. 1I, a separation layer 15b left on a single-crystal Si layer 16 of the second substrate 20 is removed using an etchant or the like. At this time, the single-crystal Si layer 16 can be used as an etching stopper layer. Then, the surface of the substrate may be planarized by performing a planarizing step such as a hydrogen annealing step, polishing step, or the like, as needed.

Figure 2:
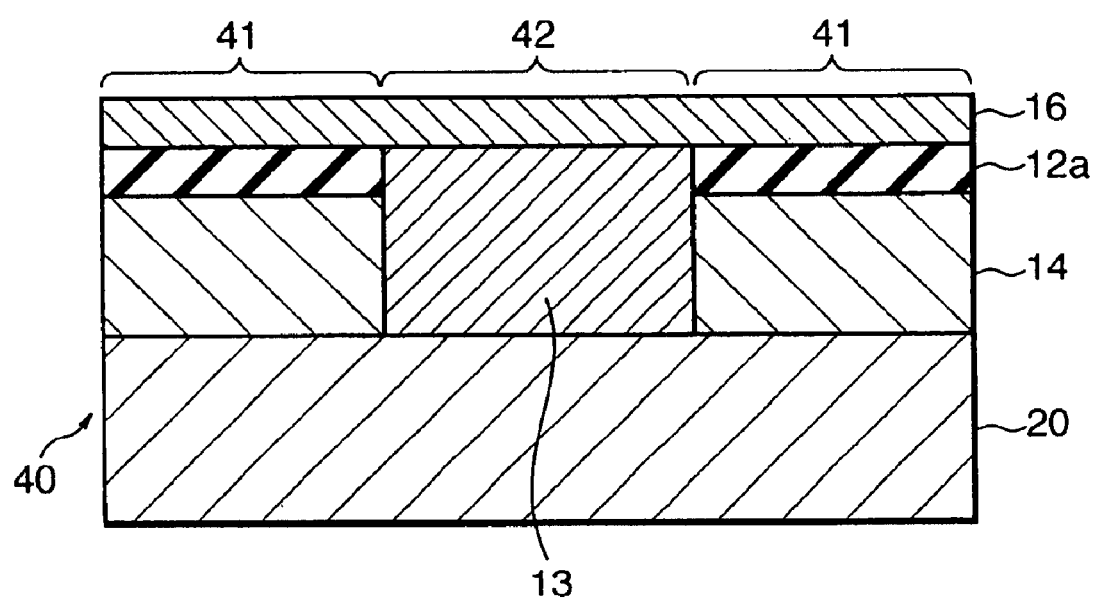
FIG. 2 is a view showing the structure of a substrate according to the first embodiment of the present invention.

With the above-mentioned method, a semiconductor substrate (partial SOI substrate) 40 as shown in FIG. 2 is obtained. The semiconductor substrate 40 shown in FIG. 2 has the thin single-crystal Si layer (first semiconductor layer) 16 on its surface and the partial SiO$_2$ layer (insulating layer) 12a and single-crystal Si layer 13 (second semiconductor layer) under the single-crystal Si layer 16. A thin single-crystal Si layer means a layer thinner than a general semiconductor substrate. To exhibit the advantages of an SOI substrate, the thickness of the single-crystal Si layer (first semiconductor layer) 16 is preferably, e.g., 10 μm or less, and more preferably, 5 nm to 2 μm.

A region (SOI region) 41 with the partial SiO$_2$ layer (insulating layer) 12a out of the semiconductor substrate 40 as a buried insulating layer has the same properties as those of an SOI substrate which has a buried insulating film over the whole region. A region (non-SOI region) 42 without the partial insulating layer 12a out of the semiconductor substrate 40, i.e., a region which has the single-crystal Si layer 13 under the single-crystal Si layer 16 has substantially the same properties as those of a general Si substrate.

If a substrate which has an epitaxial growth layer of single-crystal silicon on the surface is used as the single-crystal Si substrate 11, the region 42 has substantially the same properties as those of an Si substrate which has an epitaxial Si layer on its surface. In this case, the single-crystal Si layer 13 is a layer which is formed by epitaxial growth using as the underlying layer the single-crystal Si layer 16 formed by epitaxial growth. For this reason, a defect hardly occurs in the interface between the single-crystal Si layer 16 and the single-crystal Si layer 13. Accordingly, if the semiconductor substrate 40 is used, a high-quality device can be formed even when a device (e.g., a trench capacitor) having a structure deeper than that of a device to be formed in the SOI region is formed in the non-SOI region.

The semiconductor substrate 40 which can be manufactured by this embodiment is useful in forming a logic circuit in the SOI region 41 and forming a DRAM which has a trench-type capacitor in the non-SOI region 42. Alternatively, the semiconductor substrate 40 is useful in forming a memory cell transistor of a DRAM and a logic circuit on the SOI region 41 and forming a memory cell capacitor of the DRAM in the non-SOI region 42. Examples of the thicknesses of the single-crystal Si layer in the SOI and non-SOI regions in the semiconductor substrate 40 used to form a DRAM will be given. The single-crystal Si layer has a thickness of about 100 nm in the SOI region while it has a thickness of about several μm to 10 μm in the non-SOI region.

Figure 3:
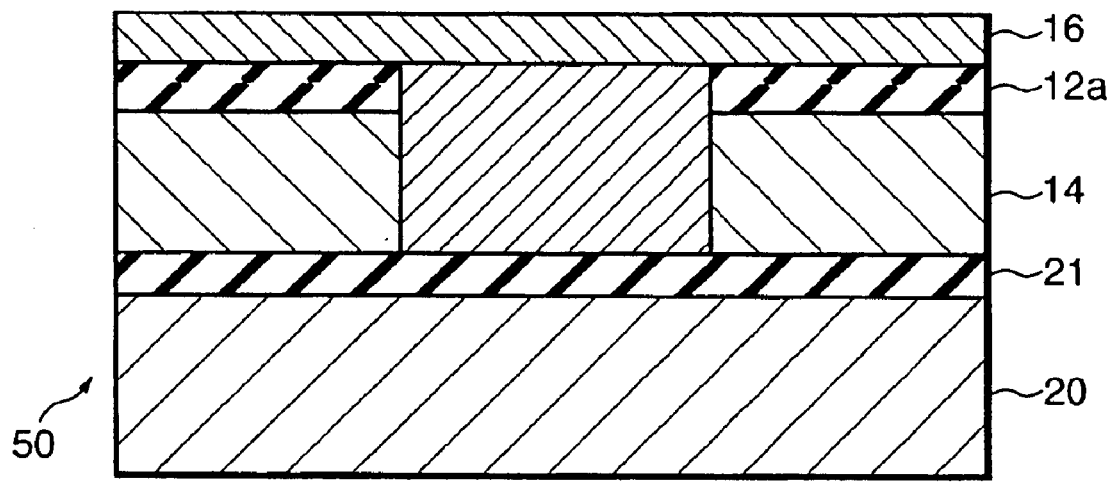
FIG. 3 is a view showing another structure of the substrate according to the first embodiment of the present invention.

When an insulating layer 21 is formed on the surface of the first substrate 10c prior to the step (bonding step) shown in FIG. 1G or when a substrate having the insulating layer 21 on its surface is adopted as the second substrate 20, a semiconductor substrate 50 as shown in FIG. 3 is finally obtained. The semiconductor substrate 50 shown in FIG. 3 has the partial insulating layer 12a under the single-crystal Si layer (first semiconductor layer) 16 and the full insulating layer 21 under and adjacent to or spaced apart from the partial insulating layer 12a. In the growth or planarization step shown in FIG. 1D or 1E, if the manufacturing conditions are determined such that the partial insulating layer 12a is exposed on the surface, the full insulating layer 21 is arranged under and adjacent to the partial insulating layer 12a. A region without the partial insulating layer 12a has an SOI layer (to be referred to as a thick-SOI region hereinafter) thicker than that of a region with the partial insulating layer 12a. With this structure, even a device which is formed in a region without the partial insulating layer 12a can dielectrically be isolated from bulk silicon.

As described above, an SOI substrate which has a partial insulating layer inside and a thin SOI layer on the partial insulating layer can be manufactured by forming a separation layer on the first substrate by ion implantation, bonding the first and second substrates together to form a bonded substrate stack, and then splitting the bonded substrate stack at the separation layer. Such an SOI substrate is thinned through the splitting step and thus has substantially the same properties as those of a general SOI substrate.

EXAMPLES

Preferred examples of the first embodiment of the present invention will be described below.

Example 1

First, a first p-type or n-type single-crystal Si substrate 11 having a resistivity of 10 to 20 Ω·cm was prepared (this corresponds to the step shown in FIG. 1A). Then, an SiO$_2$ layer 12 having a thickness of 200 nm was formed on the surface of the substrate 11 by thermal oxidation or the like (this corresponds to the step shown in FIG. 1B). Prior to the formation of the SiO$_2$ layer 12, a single-crystal Si layer may epitaxially be grown on the surface of the substrate 11. Such an epitaxial layer typically has a thickness of 300 to 400 nm.

However, the epitaxial layer may be so grown as to have a thickness of 300 nm or less, or 400 nm or more.

A mask material (preferably, SiN or the like) was deposited on the $SiO_2$ layer 12 and a resist was further applied to its surface. These materials were sequentially patterned such that an opening was formed in a non-SOI region (or a thick-SOI region) (this corresponds to the step shown in FIG. 1C). Since this example uses a bonding method in which the first substrate and second substrate are bonded together, patterning must be so performed as to form a mirror image of a normal pattern.

If a mask material is not deposited on the $SiO_2$ layer 12, a resist is applied to the $SiO_2$ layer 12 and is patterned to form a resist pattern. Then, the $SiO_2$ layer 12 is etched through an opening of the resist pattern to partially expose the surface of the single-crystal Si substrate 11.

On the other hand, if a mask material is deposited on the $SiO_2$ layer 12, a resist is applied to the mask material and is patterned to form a resist pattern. Then, the mask material is etched through an opening of the resist pattern, thereby performing patterning for the mask material. The $SiO_2$ layer 12 is etched through an opening of the mask material until the surface of the single-crystal Si substrate 11 is exposed, thereby performing patterning for the $SiO_2$ layer 12. At this time, the resist may be removed after the patterning of the mask material and before the patterning of the $SiO_2$ layer 12, as needed.

When the resist and mask material were removed, a first substrate 10 in which the surface of the single-crystal Si substrate 11 was partially exposed was obtained.

By performing the epitaxial growth step, an epitaxial Si layer 13 was formed in a region in which the surface of the single-crystal Si substrate 11 was exposed. At the same time, a polysilicon layer 14 was formed on an $SiO_2$ layer 12a (this corresponds to the step shown in FIG. 1D). The thickness of the epitaxial Si layer 13 can appropriately be determined in accordance with specifications required by a final semiconductor substrate. For example, the thickness can be set to 5 $\mu$m.

Then, the surface of the substrate was planarized by polishing (this corresponds to the step shown in FIG. 1E). As the polishing step, CMP may be performed. To remove any portion damaged by polishing in the polishing step, a cleaning step and/or etching step may further be performed.

The projection range was set such that ions were implanted at a predetermined position in the single-crystal Si substrate 11, and ions were implanted into a first substrate 10b through the surface (this corresponds to the step shown in FIG. 1F). With this operation, an ion-implanted layer 15 serving as a separation layer was formed as a microcavity layer or a heavily doped layer. This ion implantation step can be performed by, e.g., implanting hydrogen ions ($H^+$) at 360 keV and $5 \times 10^{16}$ cm$^{-2}$, and the projection range in this case is about 3.3 $\mu$m. The ion implantation step may collectively be performed for a plurality of substrates by using not a general ion implantation apparatus but a plasma apparatus. In this case, $H^{2+}$ ions may be more efficient than $H^+$ ions.

The surface of a first substrate 10c and that of a second substrate 20 separately prepared were overlaid on and brought into contact with each other. After that, both the substrates were subjected to annealing at 300° C. for 10 hrs to increase the bonding strength between the first substrate 10c and the second substrate 20 (this corresponds to the step shown in FIG. 1G). With this operation, a bonded substrate stack 30 was obtained. At this time, by performing a preprocess such as $N_2$ or $O_2$ plasma processing for the first and second substrates before the overlaying, the bonding strength can be increased. Note that annealing for increasing the bonding strength is not essential and may be skipped.

If an oxide film is formed on at least one of the surface of the first substrate 10c and that of the second substrate 20, a region in which the epitaxial Si layer 13 is grown becomes not a non-SOI region but a thick-SOI region (see FIG. 3). The thickness of the silicon film in the thick-SOI region can appropriately be determined in accordance with specifications required by a final semiconductor substrate. For example, the thickness can be set to 10 $\mu$m.

If an oxide film as described above is not formed, a region without any partial $SiO_2$ layer has not an SOI structure but substantially the same structure as that of a single-crystal Si substrate or an epitaxial Si substrate (when a substrate having an epitaxial Si layer on its surface as a single-crystal Si substrate is used) (see FIG. 2).

The bonded substrate stack 30 was annealed at 400° C. for 10 hrs, thereby splitting the bonded substrate stack 30 at the ion-implanted layer 15 (this corresponds to the step shown in FIG. 1H). Consequently, the polysilicon layer 14, the partial $SiO_2$ layer 12a, the epitaxial Si layer 13, a single-crystal Si layer 16, and a part 15b of the porous Si layer 15, which were originally formed on the side of the first substrate 10, were moved to the side of the second substrate 20. Only a porous Si layer 15a was left on the surface of a first substrate 11a.

In this splitting step, instead of the annealing, a method of injecting a fluid (liquid or gas) or inserting a solid wedge into a concave portion (concave portion formed by the beveled portions of the two substrates 10c and 20) of the periphery of the bonded substrate stack 30, a method of applying a mechanical force such as a tensile force, shearing force, or the like to the bonded substrate stack 30, a method of applying ultrasonic waves to the bonded substrate stack 30, or the like may be adopted.

Moreover, out of the two substrates constituting the bonded substrate stack, a portion from the back surface of the first base 10c to the separation layer 15 may be removed by grinding, polishing, etching, or the like without splitting the bonded substrate stack.

The separation layer 15b which was moved to the uppermost surface of the second substrate 20 was removed by polishing such as CMP or etching, and at the same time, the surface was planarized (this corresponds to the step shown in FIG. 1I). Then, a planarization step such as hydrogen annealing may be performed. Alternatively, hydrogen annealing may be performed while the separation layer 15b is partially left.

With the above-mentioned steps, a semiconductor substrate which has the single-crystal Si layer 16 with a thickness of 0.2 $\mu$m on the partial insulating layer 12a and single-crystal Si layer 13 in the partial insulating layer 12a was obtained. When the film thickness of the formed single-crystal Si layer 16 was measured at 100 points across the surface, the uniformity of the film thickness was 201 nm±5 nm.

The observation of the cross section with a transmission electron microscope showed that the single-crystal Si layer 16 had no fresh crystal defects and maintained good crystallinity.

The surface roughness of a formed substrate 40 was evaluated with an atomic force microscope. The mean square roughness in a 50-$\mu$m-square region was about 0.2 nm, which was equivalent to that of a commercially available silicon wafer.

In the above-mentioned manufacturing method, a substrate containing, e.g., SiGe, GaAs, SiC, C, or the like on its surface may be adopted instead of the single-crystal Si substrate 11. In this case, a layer to be grown on the surface (region in a partial insulating layer) of the substrate may preferably be made of the same material as that of its underlying layer.

As the second substrate 20, a substrate made of, e.g., quartz, sapphire, ceramic, carbon, SiC, or the like may be adopted, in addition to an Si substrate.

Example 2

A DRAM having a trench capacitor was formed in the non-SOI region of a semiconductor substrate which was manufactured by the method described in the example 1 and had a structure shown in FIG. 2. Other devices including a logic circuit were formed in the SOI region. In the lithography step, the entire region of exposure shots fell within the focus-range of the depth of a projection optical system, and no local defocusing (defocusing due to unevenness of the surface of the substrate) occurred. Since a single-crystal Si layer having a sufficient thickness was formed in the non-SOI region, no trouble occurred in forming the trench capacitor.

The above semiconductor substrate is effectively used to form an integrated circuit other than a DRAM-embedded one.

[Second Embodiment]

FIGS. 4A to 4J are views for explaining a substrate manufacturing method according to the second embodiment of the present invention. In the step shown in FIG. 4A, a single-crystal Si substrate (seed substrate) 111 is prepared. As the single-crystal Si substrate 111, a substrate having an epitaxial growth layer of single-crystal silicon on its surface may be employed.

Figure 4A:
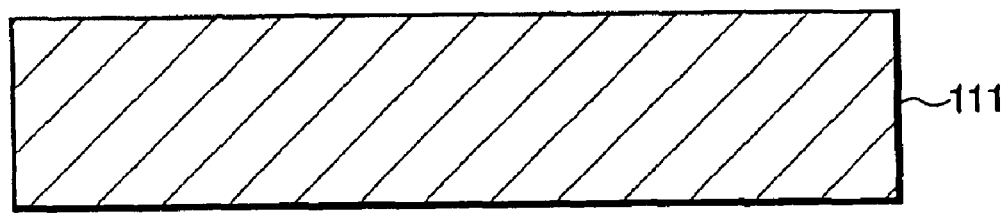
FIGS. 4A to 4J are views for explaining a substrate manufacturing method according to the second embodiment of the present invention.
Figure 4B:
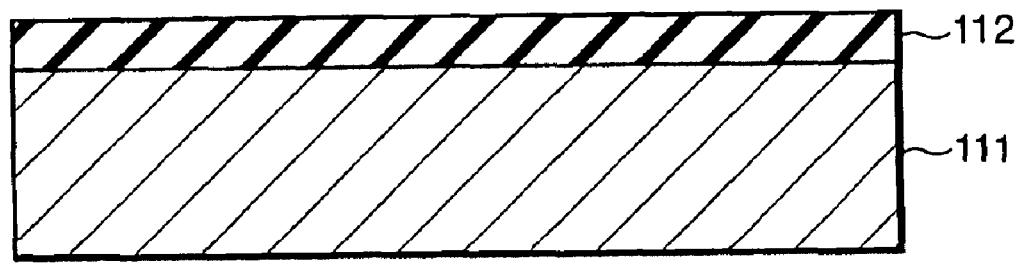

In the step shown in FIG. 4B, an $SiO_2$ layer 112 serving as an insulating layer is formed on the single-crystal Si substrate 111. The $SiO_2$ layer 112 can be formed by, e.g., thermal oxidation. Thermal oxidation can form an $SiO_2$ layer of good quality.

Figure 4C:
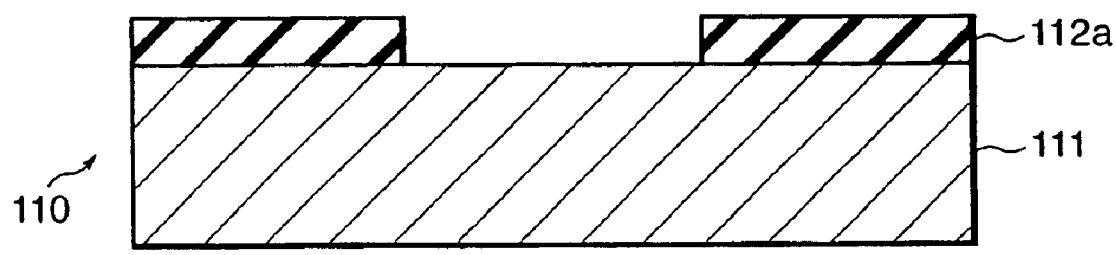

In the step shown in FIG. 4C, the $SiO_2$ layer 112 is patterned to form a partial $SiO_2$ layer 112a. A partial $SiO_2$ layer is defined as an $SiO_2$ layer which is formed such that the single-crystal Si substrate 111 or an underlying semiconductor region (e.g., an epitaxial growth Si layer if a substrate having the Si layer on its surface is adopted as the single-crystal Si substrate 111) is at least partially exposed. The $SiO_2$ layer 112 can be patterned by, e.g., the following operation. After a mask material is formed on the $SiO_2$ layer 112, the mask material is patterned by lithography (resist coating, exposure, development, and etching) to form an opening. The $SiO_2$ layer 112 exposed at the bottom of the opening is then etched by, e.g., reactive ion etching (RIE).

This step forms a first substrate 110 which has the partial $SiO_2$ layer (insulating layer) 112a on the single-crystal Si substrate 111.

Instead of the steps shown in FIGS. 4B and 4C, e.g., a step of covering the surface except a region in which the partial $SiO_2$ layer 112a is to be formed with a mask pattern and forming the partial $SiO_2$ layer 112a only in an exposed portion may be adopted.

Figure 4D:
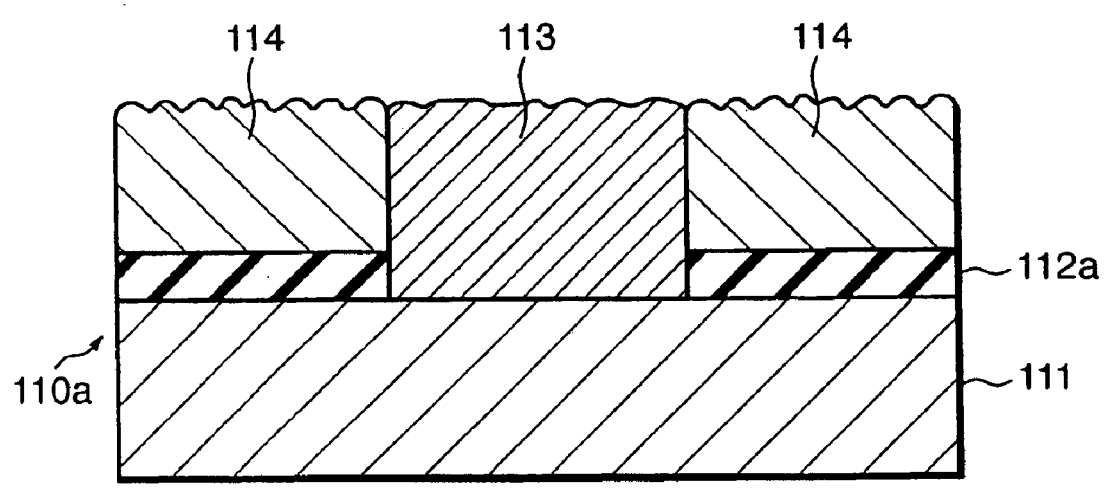

In the step shown in FIG. 4D, a single-crystal Si layer (semiconductor layer) 113 is grown by epitaxial growth on an exposed portion of the single-crystal Si substrate (semiconductor region) 111 in the partial $SiO_2$ layer 112a of the first substrate 110. At this time, a polysilicon layer (non-single-crystal semiconductor layer) 114 may be formed on the partial insulating layer 112a. The single-crystal Si layer 113 may be grown on the single-crystal Si substrate 111 under the condition that the polysilicon layer 114 be not formed on the partial insulating layer 112a.

Typically, the single-crystal Si layer 113 and polysilicon layer 114 are different in growth rate, and a level difference may occur between the single-crystal Si layer 113 and the polysilicon layer 114. Three-dimensional patterns can be formed on the surfaces of the single-crystal Si layer 113 and polysilicon layer 114, respectively.

Figure 4E:
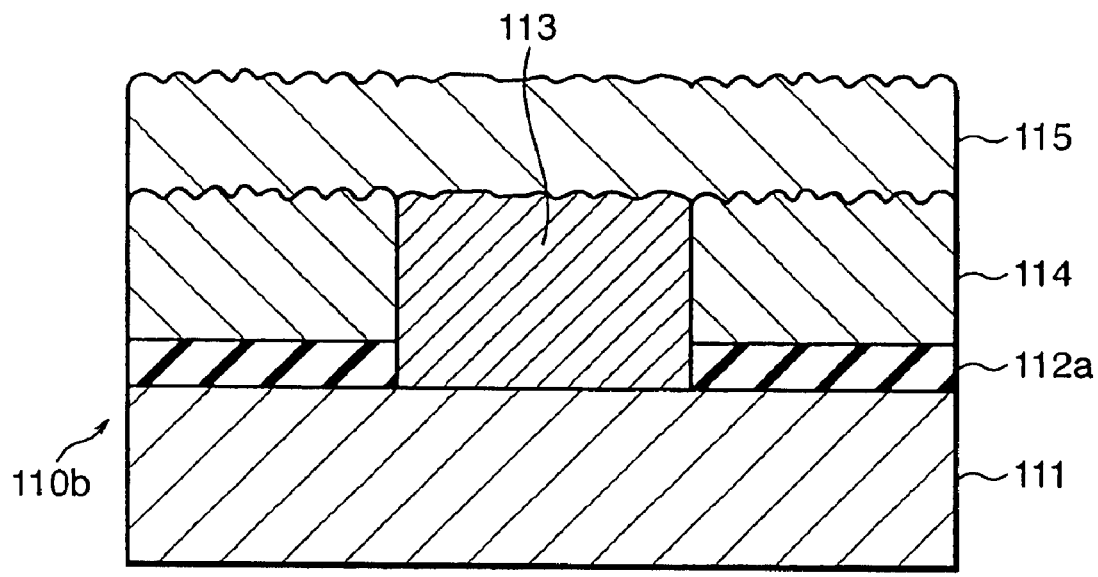

In the step shown in FIG. 4E, a bonding layer (second layer) 115 to be bonded to the second substrate is formed on the single-crystal Si layer 113 and polysilicon layer 114, i.e., the entire surface of a first substrate 110a. The bonding layer preferably has a substantially uniform structure (structure which can uniformly be polished) to facilitate planarization in the subsequent planarizing step. The bonding layer 115 may comprise a semiconductor layer or a layer made of a material other than a semiconductor material. As the bonding layer 115, e.g., a polysilicon layer, an amorphous Si layer, an oxide film (e.g., an $SiO_2$ layer formed by CVD or the like), a PSG layer, a BPSG layer, or the like is preferably used. If an $SiO_2$ layer is to be formed as the bonding layer 115, the $SiO_2$ layer may be formed by thermal oxidation, but CVD is more preferable. This is because thermal oxidation reflects the shape of an underlying layer in the surface shape of the $SiO_2$ layer while CVD tends to make the underlying layer have a more gently stepped surface.

The formation of the bonding layer 115 can planarize the surface of a first substrate 110b. This contributes to an increase in bonding strength between the first and second substrates and ease of bonding, in the subsequent bonding step. The formation of the bonding layer 115 is also effective in keeping a portion (the surface portion of the single-crystal Si substrate 111, i.e., a single-crystal Si layer 116 to be described later) finally serving as an active layer away from the second substrate to be bonded to the first substrate.

To improve the planarity of the surface of the first substrate 110b, the surface of the first substrate 110a (see FIG. 4D), in which the single-crystal Si layer 113 and polysilicon layer 114 are combined, is preferably planarized by polishing, grinding, or the like before forming the bonding layer 115. In this case, even without performing the planarizing step after the formation of the bonding layer 115, the first substrate having good surface planarity can be obtained.

Figure 4F:
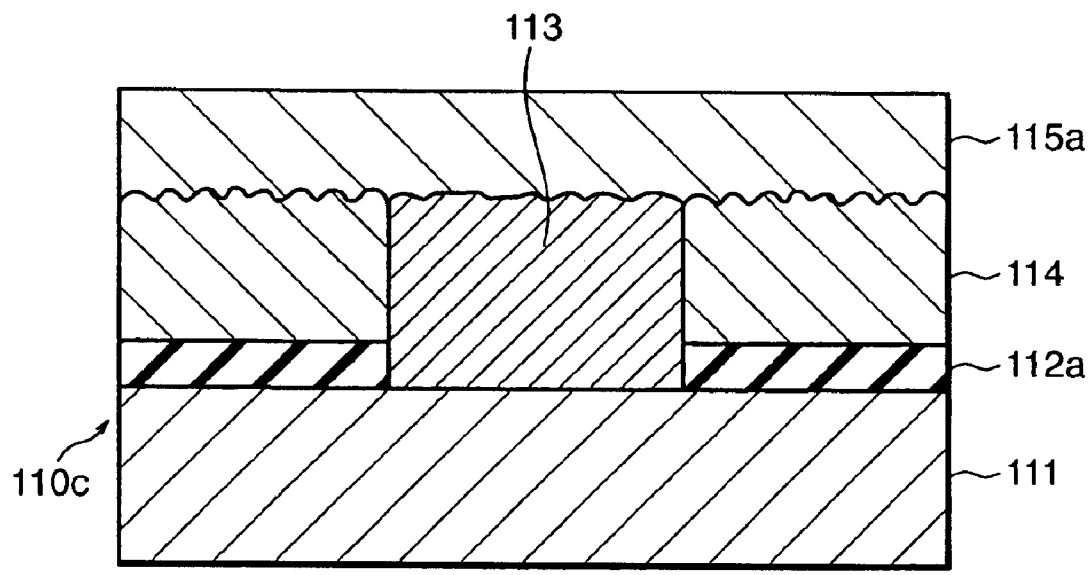

The step (planarization step) shown in FIG. 4F is a step performed when a three-dimensional pattern on the surface of the first substrate 110b (see FIG. 4E) is not negligible. The surface of the first substrate 110b is planarized by polishing, grinding, or the like. With this planarization of the bonding layer 115, the bonding strength between the first and second substrates and ease of bonding in the subsequent bonding step can further be increased.

In some cases, it is not preferable to perform the step of planarizing the surface of the first substrate 110a, in which the single-crystal Si layer 113 and polysilicon layer 114 are combined, without performing the bonding layer formation step shown in FIG. 4E and immediately afterward bonding the first substrate to the second substrate. More specifically, even if the planarizing step is performed for the surface of the first substrate 110a, in which the single-crystal Si layer 113 and polysilicon layer 114 are combined, it is difficult to obtain good planarity. For example, the planarizing step suitable for the single-crystal Si layer 113 does not impart good planarity to the polysilicon layer 114 while the planarizing step suitable for the polysilicon layer 114 does not impart good planarity to the single-crystal Si layer 113. Additionally, a level difference may occur between the single-crystal Si layer 113 and polysilicon layer 114.

Figure 4G:
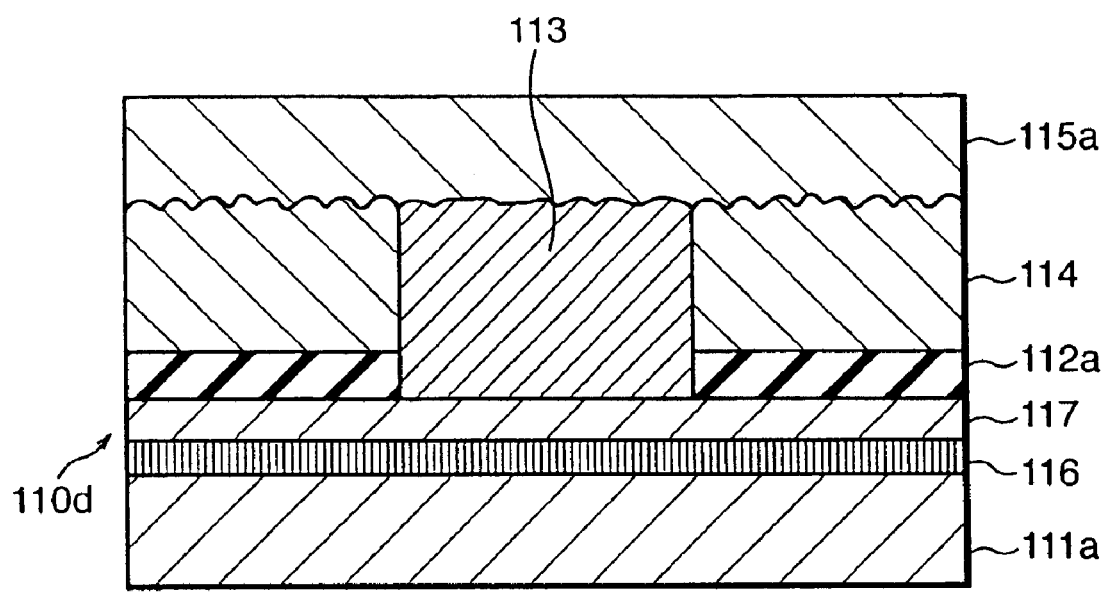

In the step shown in FIG. 4G, ions such as hydrogen ions or helium ions are implanted at a position deeper than that of the partial $SiO_2$ layer 112a of a first substrate 110c through the surface of the first substrate 110c to form an ion-implanted layer serving as the separation layer 116 at a position under and spaced apart from the lower surface of the partial $SiO_2$ layer 112a and single-crystal Si layer 113. With this operation, under the partial $SiO_2$ layer 112a and single-crystal Si layer 113, the surface portion of the original single-crystal Si substrate 111 is left as a single-crystal Si layer 117, the separation layer 116 is formed under the single-crystal Si layer 117, and the main portion (portion other than the surface portion) of the original single-crystal Si substrate 111 is left as a single-crystal Si portion 111a. This ion implantation step can be performed before the step shown in FIG. 4F.

Figure 4H:
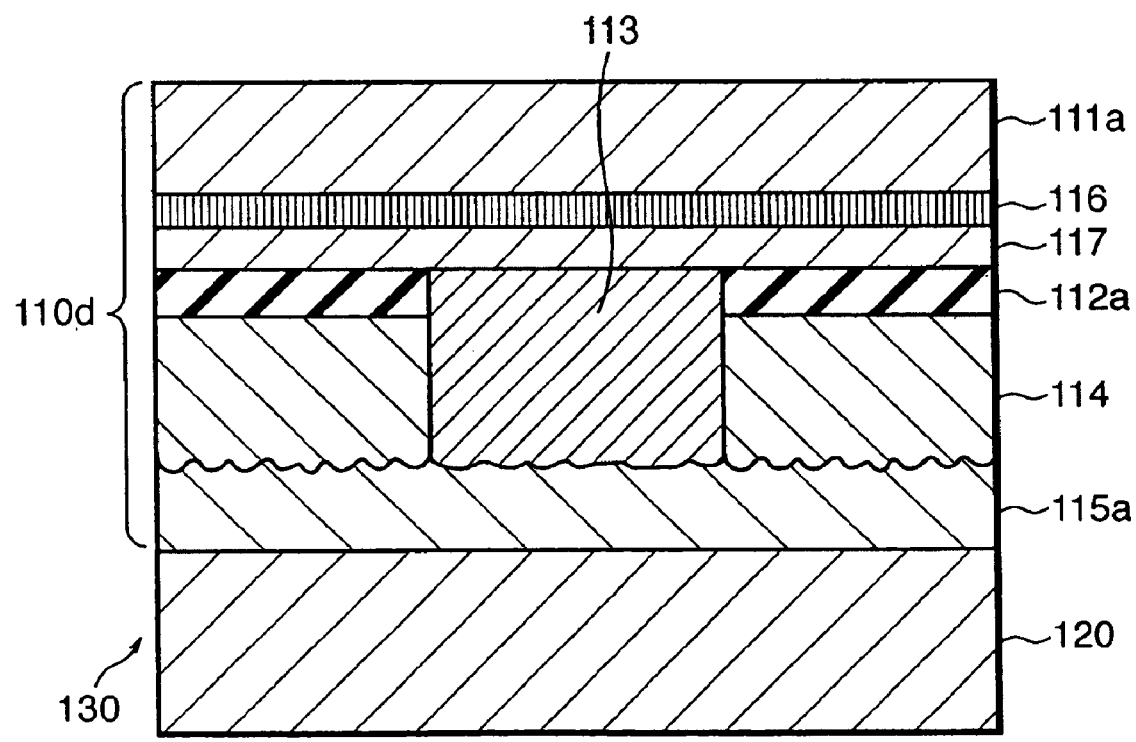

In the step shown in FIG. 4H, a second substrate (handle substrate) 120 is bonded to a bonding layer 115a of a first substrate 110d shown in FIG. 4G to form a bonded substrate stack 130. An $SiO_2$ layer (insulating layer) may further be formed on the surface of the first substrate 110d by, e.g., thermal oxidation, prior to the bonding (except in cases in which the bonding layer 115 comprises an insulting film such as an $SiO_2$ layer). At this time, if a thermal oxidation step at 400° C. or more is necessary, the thermal oxidation step is performed before the ion implantation step. As the second substrate 120, a single-crystal Si substrate or a substrate obtained by forming an insulating layer such as an $SiO_2$ layer on the surface can typically be used. However, any other substrate such as an insulating substrate (e.g., a glass substrate) may be adopted as the second substrate 120.

Figure 4I:
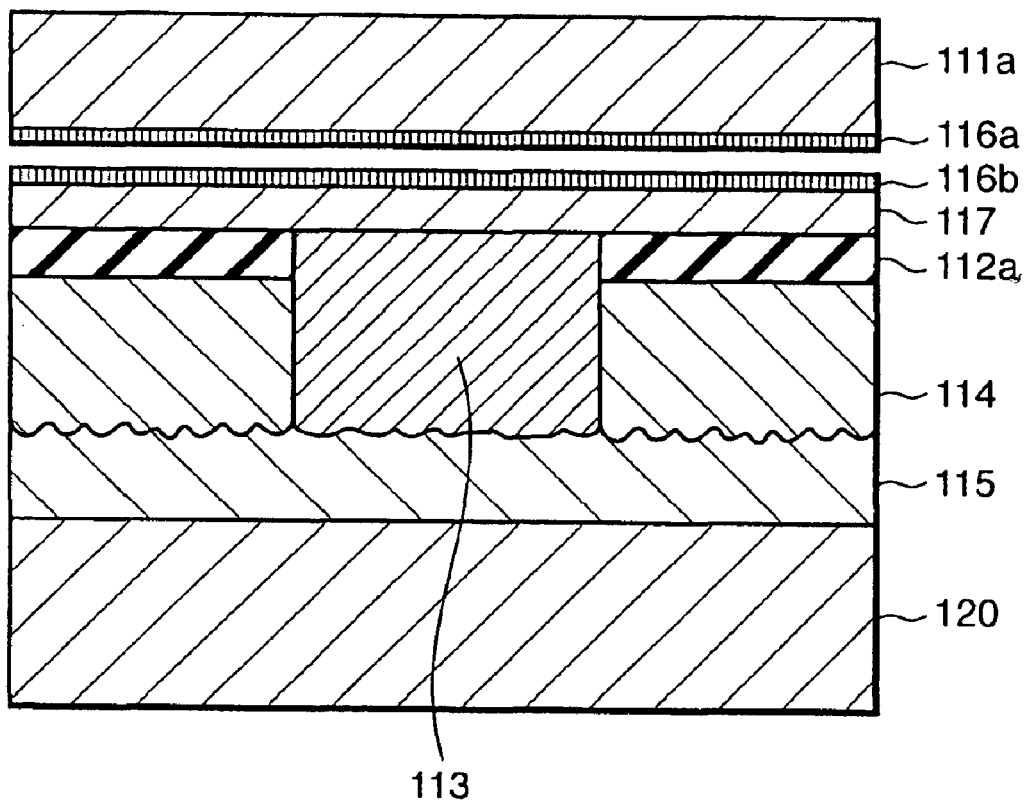

In the step shown in FIG. 4I, the bonded substrate stack 130 is split into two substrates by cutting the bonded substrate stack 130 at the separation layer 116. This splitting may be performed by, e.g., annealing the bonded substrate stack 130. Alternatively the splitting can be performed by using a fluid. As a method of using a fluid, a method of forming a jet of a fluid (liquid or gas) and injecting it to the separation layer 116, a method of utilizing the static pressure of a fluid, or the like is preferably used. Among these methods, a method of utilizing water as a fluid is referred to as a water jet method. Additionally, the splitting can also be performed by, e.g., inserting a member such as a solid wedge into the separation layer 116.

In addition to the above-mentioned splitting methods, a grinding and polishing method in which the back surface (exposed surface) of the first substrate 110d is ground and polished to leave a single-crystal Si layer with a predetermined thickness on the insulating layer 112a may be adopted. In this case, the separation layer 116 need not be formed in advance.

Figure 4J:
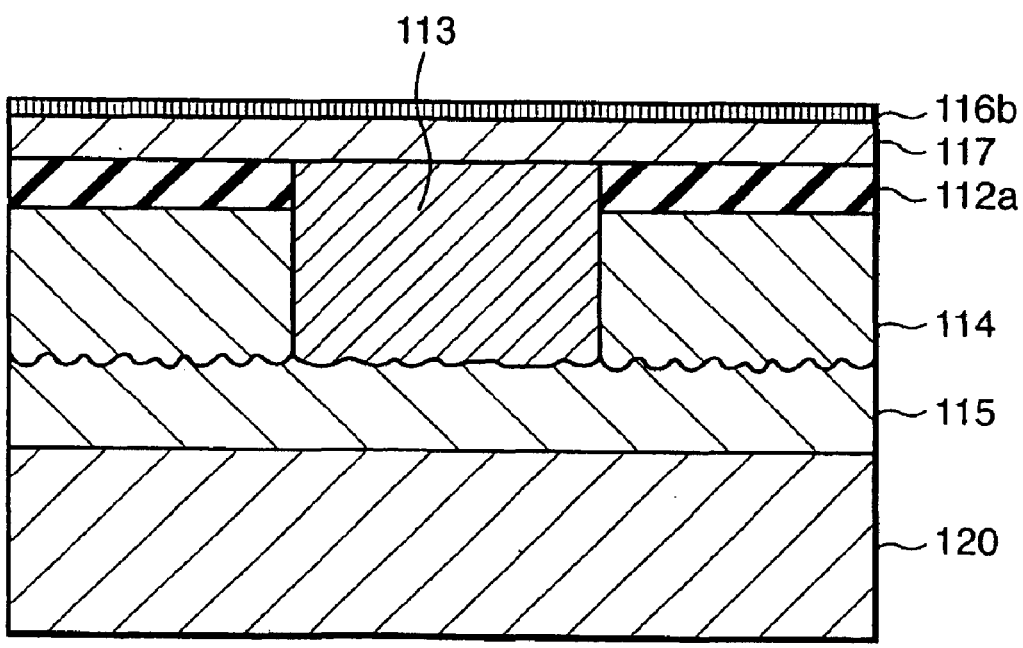

In the step shown in FIG. 4J, a separation layer 116b left on the single-crystal Si layer 117 of the second substrate 120 is removed using an etchant or the like. At this time, the single-crystal Si layer 117 can be used as an etching stopper layer. Then, the surface of the substrate may be planarized by performing a planarizing step such as a hydrogen annealing step, polishing step, or the like, as needed.

Figure 5:
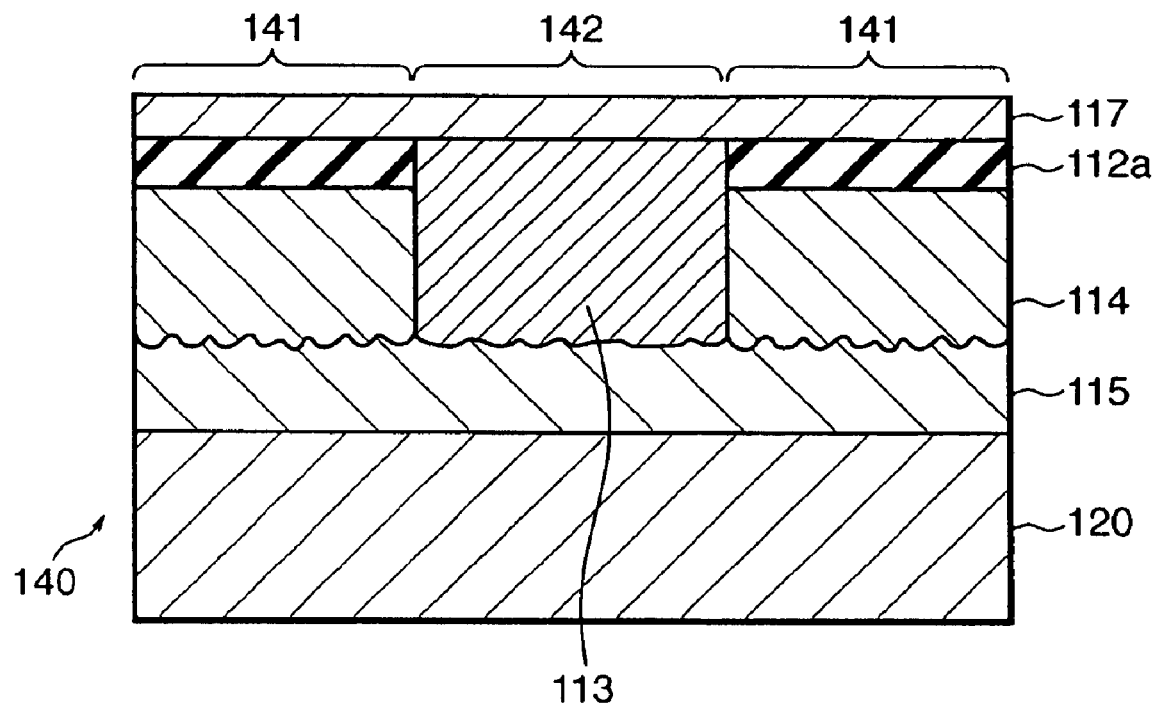
FIG. 5 is a view showing the structure of a substrate according to the second embodiment of the present invention.

With the above-mentioned method, a semiconductor substrate (partial SOI substrate) 140 as shown in FIG. 5 is obtained. The semiconductor substrate 140 shown in FIG. 5 has the thin single-crystal Si layer (first semiconductor layer) 117 on its surface and the partial $SiO_2$ layer (insulating layer) 112a and single-crystal Si layer (second semiconductor layer) 113 under the single-crystal Si layer 117. A thin single-crystal Si layer means a layer thinner than a general semiconductor substrate. To exhibit the advantages of an SOI substrate, the thickness of the single-crystal Si layer (first semiconductor layer) 117 is preferably, e.g., 10 $\mu$m or less, and more preferably, 5 nm to 2 $\mu$m.

A region (SOI region) 141 with the partial $SiO_2$ layer (insulating layer) 112a out of the semiconductor substrate 140 as a buried insulating layer has the same properties as those of an SOI substrate which has a buried insulating film over the whole region. A region (non-SOI region) 142 without the partial insulating layer 112a out of the semiconductor substrate 140, i.e., a region which has the single-crystal Si layer 113 under the single-crystal Si layer 117 has substantially the same properties as those of a general Si substrate.

If a substrate which has an epitaxial growth layer of single-crystal silicon on the surface is used as the single-crystal Si substrate 111, the region 142 has substantially the same properties as those of an Si substrate which has an epitaxial Si layer on its surface. In this case, the single-crystal Si layer 113 is a layer which is formed by epitaxial growth using as the underlying layer the single-crystal Si layer 117 formed by epitaxial growth. For this reason, a defect hardly occurs in the interface between the single-crystal Si layer 117 and the single-crystal Si layer 113. Accordingly, if the semiconductor substrate 140 is used, a high-quality device can be formed even when a device (e.g., a trench capacitor) having a structure deeper than that of a device to be formed in the SOI region is formed in the non-SOI region.

The semiconductor substrate 140 which can be manufactured by this embodiment is useful in forming a logic circuit in the SOI region 141 and forming a DRAM which has a trench-type capacitor in the non-SOI region 142. Alternatively, the semiconductor substrate 140 is useful in forming a memory cell transistor of a DRAM and a logic circuit on the SOI region 141 and forming a memory cell capacitor of the DRAM in the non-SOI region 142. Examples of the thicknesses of the single-crystal Si layer in the SOI and non-SOI regions in the semiconductor substrate 140 used to form a DRAM will be given. The single-crystal Si layer has a thickness of about 100 nm in the SOI region while it has a thickness of about several $\mu$m to 10 $\mu$m in the non-SOI region.

Figure 6:
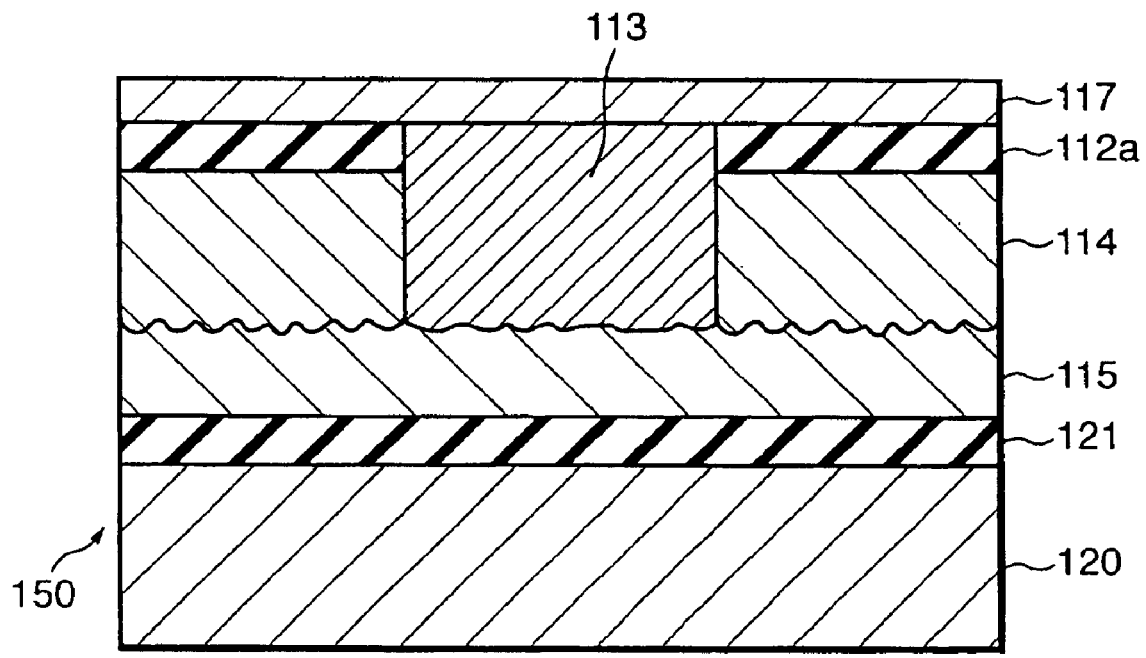
FIG. 6 is a view showing another structure of the substrate according to the second embodiment of the present invention.

When an insulating layer 121 is formed on the surface of the first substrate 110d prior to the step (splitting step) shown in FIG. 4H or when a substrate having the insulating layer 121 on its surface is adopted as the second substrate 120, a semiconductor substrate 150 as shown in FIG. 6 is finally obtained. The semiconductor substrate 150 shown in FIG. 6 has the partial insulating layer 112a under the single-crystal Si layer (first semiconductor layer) 117 and the full insulating layer 121 under and adjacent to or spaced apart from the partial insulating layer 112a.

As described above, according to this embodiment, the formation of a bonding layer on the surface of the first substrate improves the planarity of the surface of the first substrate and facilitates bonding to the second substrate.

EXAMPLES

Preferred examples of the second embodiment of the present invention will be described below.

Example 1

First, a first p-type or n-type single-crystal Si substrate 111 having a resistivity of 10 to 20 $\Omega$·cm was prepared (this corresponds to the step shown in FIG. 4A). Then, an SiO$_2$ layer 112 having a thickness of 200 nm was formed on the surface of the substrate 111 by thermal oxidation or the like (this corresponds to the step shown in FIG. 4B). Prior to the formation of the SiO$_2$ layer 112, a single-crystal Si layer may epitaxially be grown on the surface of the substrate 111. Such an epitaxial layer typically has a thickness of 300 to 400 nm. However, the epitaxial layer may be so grown as to have a thickness of 300 nm or less, or 400 nm or more.

A mask material (preferably, SiN or the like) was deposited on the oxide film and a resist was further applied to its surface. These materials were sequentially patterned such that an opening was formed in a non-SOI region (or a thick-SOI region) (this corresponds to the step shown in FIG. 4C). Since this example uses a bonding method in which the first substrate and second substrate are bonded together, patterning must be so performed as to form a mirror image of a normal pattern.

If a mask material is not deposited on the SiO$_2$ layer 112, a resist is applied to the SiO$_2$ layer 112 and is patterned to form a resist pattern. Then, the SiO$_2$ layer 112 is etched through an opening of the resist pattern to partially expose the surface of the single-crystal Si substrate 111.

On the other hand, if a mask material is deposited on the SiO$_2$ layer 112, a resist is applied to the mask material and is patterned to form a resist pattern. Then, the mask material is etched through an opening of the resist pattern, thereby performing patterning for the mask material. The SiO$_2$ layer 112 is etched through an opening of the mask material until the surface of the single-crystal Si substrate 111 is exposed, thereby performing patterning for the SiO$_2$ layer 112. At this time, the resist may be removed after the patterning of the mask material and before the patterning of the SiO$_2$ layer 112, as needed.

When the resist and mask material were removed, a first substrate 110 in which the surface of the single-crystal Si substrate 111 was partially exposed was obtained.

By performing the epitaxial growth step, an epitaxial Si layer 113 was formed in a region in which the surface of the single-crystal Si substrate 111 was exposed. At the same time, a polysilicon layer 114 was formed on an SiO$_2$ layer 112a (this corresponds to the step shown in FIG. 4D). The thickness of the epitaxial Si layer 113 can appropriately be determined in accordance with specifications required by a final semiconductor substrate. For example, the thickness can be set to 5 μm.

A polysilicon layer having a thickness of 3 μm was grown as a bonding layer 115 on the entire surface of a first substrate 110a (this corresponds to the step shown in FIG. 4E). The thickness of the bonding layer can be changed in accordance with required planarity or the like of the first substrate. As the bonding layer 115, an insulating layer such as an amorphous Si layer, an oxide film (e.g., an SiO$_2$ layer formed by CVD or the like), a PSG layer, a BPSG layer, or the like in addition to a polysilicon layer is preferably used. An insulating layer such as an SiO$_2$ layer may be formed on the bonding layer 115 (except in cases in which the bonding layer comprises an insulting layer).

Then, the surface (bonding layer 115) of a first substrate 110b was planarized by polishing (this corresponds to the step shown in FIG. 4F). As the polishing step, CMP may be performed. To remove any portion damaged by polishing in the polishing step, a cleaning step and/or etching step may further be performed.

The projection range was set such that ions were implanted at a predetermined position in the single-crystal Si substrate 111, and ions were implanted into a first substrate 110d through the surface (this corresponds to the step shown in FIG. 4G). With this operation, an ion-implanted layer 116 serving as a separation layer was formed as a microcavity layer or a heavily doped layer. This ion implantation step can be performed by, e.g., implanting hydrogen ions (H$^+$) at 600 keV and 5×10$^{16}$ cm$^{-2}$, and the projection range in this case is about 6.3 μm. The ion implantation step may collectively be performed for a plurality of substrates by using not a general ion implantation apparatus but a plasma apparatus. In this case, H$_2^+$ ions may be more efficient than H$^+$ ions.

The surface of the first substrate 110d and that of a second substrate 120 separately prepared were overlaid on and brought into contact with each other. After that, both the substrates were subjected to annealing at 300° C. for 10 hrs to increase the bonding strength between a first substrate 110c and the second substrate 120 (this corresponds to the step shown in FIG. 4H). With this operation, a bonded substrate stack 130 was obtained. At this time, by performing a preprocess such as N$_2$ or O$_2$ plasma processing for the first and second substrates before the overlaying, the bonding strength can be increased. Note that annealing for increasing the bonding strength is not essential and may be skipped.

If an oxide film is formed on at least one of the surface of the first substrate 110d and that of the second substrate 120 or if a bonding layer 117 is used as an insulating layer, a region in which the epitaxial Si layer 113 is grown becomes not a non-SOI region but a thick-SOI region (see FIG. 6). The thickness of the silicon film in the thick-SOI region can appropriately be determined in accordance with specifications required by a final semiconductor substrate. For example, the thickness can be set to 10 μm.

If an oxide film as described above is not formed, a region without any partial SiO$_2$ layer has not an SOI structure but substantially the same structure as that of a single-crystal Si substrate or an epitaxial Si substrate (when a substrate having an epitaxial Si layer on its surface as a single-crystal Si substrate is used) (see FIG. 5).

The bonded substrate stack 130 was annealed at 400° C. for 10 hrs, thereby splitting the bonded substrate stack 130 at the ion-implanted layer 116 (this corresponds to the step shown in FIG. 4I). Consequently, the polysilicon layer 114, the partial SiO$_2$ layer 112a, the epitaxial Si layer 113, the single-crystal Si layer 117, and a part 116b of the porous Si layer 116, which were originally formed on the side of the first substrate 110, were moved to the side of the second substrate 120. Only a porous Si layer 116a was left on the surface of a first substrate 111a.

In this splitting step, instead of the annealing, a method of injecting a fluid (liquid or gas) or inserting a solid wedge into a concave portion (concave portion formed by the beveled portions of the two substrates 110d and 120) of the periphery of the bonded substrate stack 130, a method of applying a mechanical force such as a tensile force, shearing force, or the like to the bonded substrate stack 130, a method of applying ultrasonic waves to the bonded substrate stack 130, or the like may be adopted.

Moreover, out of the two substrates constituting the bonded substrate stack, a portion from the back surface of the first base 110d to the separation layer 116 may be removed by grinding, polishing, etching, or the like without splitting the bonded substrate stack.

The separation layer 116b which was moved to the uppermost surface of the second substrate 120 was removed by polishing such as CMP or etching, and at the same time, the surface was planarized (this corresponds to the step shown in FIG. 4J). Then, a planarization step such as hydrogen annealing may be performed. Alternatively, hydrogen annealing may be performed while the separation layer 116b is partially left.

With the above-mentioned steps, a semiconductor substrate which has the single-crystal Si layer 117 with a thickness of 0.2 µm on the partial insulating layer 112a and single-crystal Si layer 113 in the partial insulating layer 112a was obtained. When the film thickness of the formed single-crystal Si layer 117 was measured at 100 points across the surface, the uniformity of the film thickness was 201 nm±5 nm.

The observation of the cross section with a transmission electron microscope showed that the single-crystal Si layer 117 had no fresh crystal defects and maintained good crystallinity.

The surface roughness of a formed substrate 140 was evaluated with a substrate atomic force microscope. The mean square roughness in a 50-µm-square region was about 0.2 nm, which was equivalent to that of a commercially available silicon wafer.

In the above-mentioned manufacturing method, a substrate containing, e.g., SiGe, GaAs, SiC, C, or the like on its surface may be adopted instead of the single-crystal Si substrate 111. In this case, a layer to be grown on the surface (region in a partial insulating layer) of the substrate may preferably be made of the same material as that of its underlying layer.

As the second substrate 120, a substrate made of, e.g., quartz, sapphire, ceramic, carbon, SiC, or the like may be adopted, in addition to an Si substrate.

Example 2

A DRAM having a trench capacitor was formed in the non-SOI region of a semiconductor substrate which was manufactured by the method described in the example 1 and had a structure shown in FIG. 5. Other devices including a logic circuit were formed in the SOI region. In the lithography step, the entire region of exposure shots fell within the focus-range of the depth of a projection optical system, and no local defocusing (defocusing due to unevenness of the surface of the substrate) occurred. Since a single-crystal Si layer having a sufficient thickness was formed in the non-SOI region, no trouble occurred in forming the trench capacitor.

The above semiconductor substrate is effectively used to form an integrated circuit other than a DRAM-embedded one.

[Third Embodiment]

This embodiment relates to an improved example of the first and second embodiments and, more particularly, to an improved example of a step (FIGS. 1D and 4D) of growing a single-crystal semiconductor layer such as a single-crystal Si layer, or the like in a semiconductor region exposed in a partial insulating layer and growing a non-single-crystal semiconductor layer (e.g., a polycrystalline semiconductor layer) on the partial insulating layer.

Figure 7:
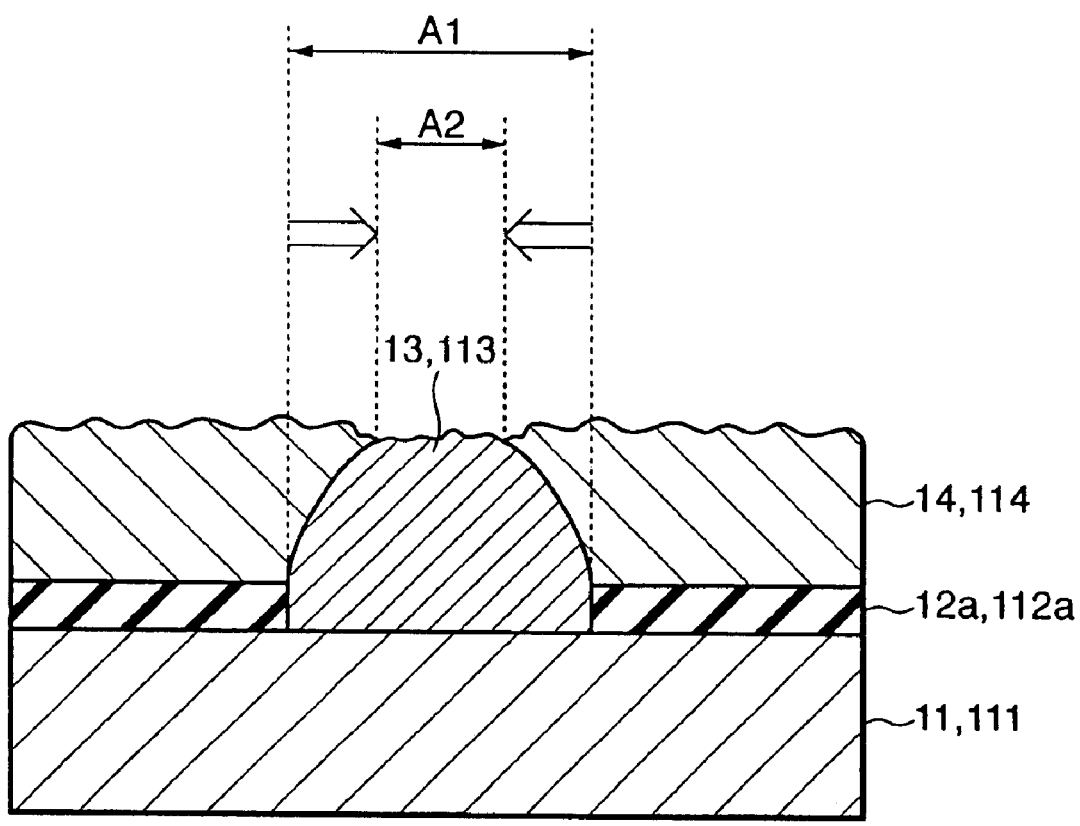
FIG. 7 is a view for explaining reduction in a non-SOI region or thick-SOI region to be formed.

FIG. 7 is a view for explaining reduction in a non-SOI region or thick-SOI region to be formed. In growing a single-crystal Si layer 13 (113) on a single-crystal Si substrate 11 (111) exposed in a partial insulating layer 12a (112a), a polysilicon layer 14 (114) is typically simultaneously grown on the partial insulating layer 12a (112a). At this time, if the growth rate of the polysilicon layer 14 (114) is higher than that of the single-crystal Si layer (113), polysilicon intrudes into a region (i.e., a non-SOI or thick-SOI region to be formed) A1 without the partial insulating layer 12a (112a). This reduces the size of the non-SOI or thick-SOI region to be formed. FIG. 7 schematically shows a state in which the region A1 has reduced to a region A2 on the surface of the substrate.

A remarkable decrease in size of the non-SOI- or thick-SOI region to be formed makes it impossible to effectively utilize a non-SOI or thick-SOI region. This creates a need for enlarging a boundary region between a non-SOI or thick-SOI region and an SOI region, thus resulting in the failure of any increase in integration degree of a device.

Figure 8:
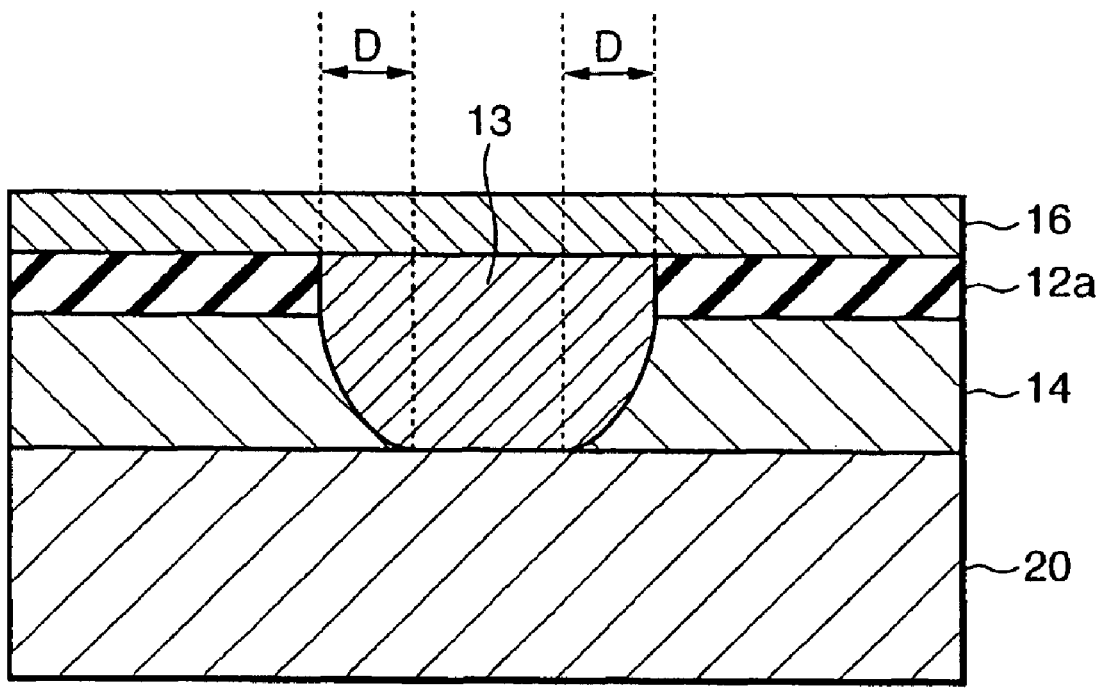
FIG. 8 is a view for explaining reduction in a non-SOI region to be formed.

FIG. 8 schematically shows a partial SOI substrate which can be manufactured in accordance with the first embodiment and whose non-SOI region has reduced. In an example shown in FIG. 8, the non-SOI region has reduced by a region D. Although there are available application examples in which the presence of the region D does not affect the integration degree of a device, generally, the presence of the region D is not preferable.

Under the circumstances, in this embodiment, a method of solving a problem that a non-SOI or thick-SOI region may reduce will be explained. For the sake of descriptive simplicity, only steps (semiconductor layer growth steps) corresponding to FIG. 1D (first embodiment) and FIG. 4D (second embodiment) will be described.

Figure 9A:
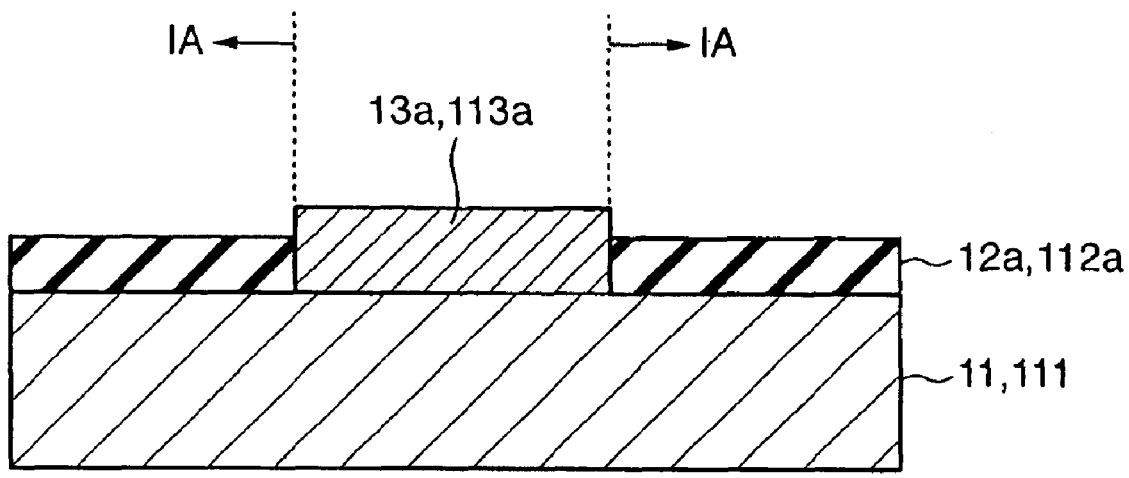
FIG. 9A is a view showing the first step (first growth step) of the semiconductor layer growth process.
Figure 9B:
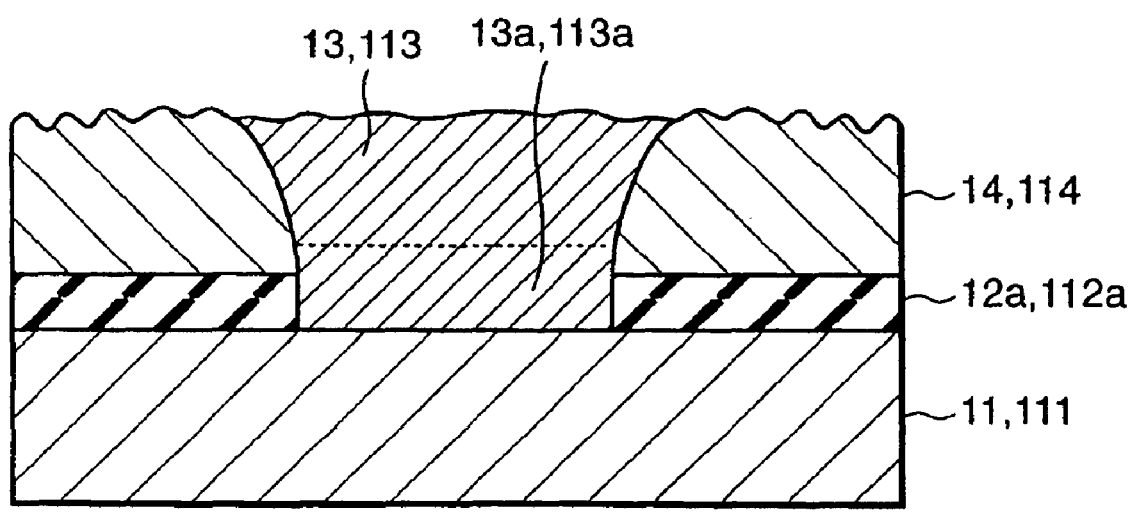
FIG. 9B is a view showing the second step (second growth step) of the semiconductor layer growth process.

FIG. 9A is a view showing the first step (first growth step) of the semiconductor layer growth process, and FIG. 9B is a view showing the second step (second growth step) of the semiconductor layer growth process. If the semiconductor layer growth process according to this embodiment is applied to the first embodiment, the steps are performed in the order of FIGS. 1A, 1B, 1C, 9A, 9B, 1E, 1F, 1G, 1H, and 1I. On the other hand, if the semiconductor layer growth process of this embodiment is applied to the second embodiment, the steps are performed in the order of FIGS. 4A, 4B, 4C, 9A, 9B, 4E, 4F, 4G, 4H, 4I, and 4J.

In the first step of the semiconductor growth process, a single-crystal Si layer 13a (113a) is epitaxially grown on the surface of the single-crystal Si substrate (semiconductor region) 11 (111) exposed in the partial insulating layer 12a (112a) under the condition that a non-single-crystal semiconductor layer such as a polycrystalline semiconductor layer do not grow on the partial insulating layer 12a (112a), as exemplified in FIG. 9A. More specifically, in the first step, the single-crystal Si layer 13a (113a) is selectively grown in the partial insulating layer 12a (112a).

The film thickness of the single-crystal Si layer 13a (113a) is determined such that polysilicon fits in a region IA on the partial insulating layer 12a (112a) in further growing a single-crystal Si layer on the single-crystal Si layer 13a (113a) and growing a polysilicon layer on the partial insulating layer 12a (112a) in the next step (FIG. 9B). More specifically, for example, the film thickness of the single-crystal Si layer 13a (113a) is preferably larger than that of the partial insulating layer 12a (112a).

In the second step of the semiconductor growth process, the polysilicon layer 14 (114) and single-crystal Si layer 13 (113) are grown under the condition that a non-single-crystal semiconductor layer such as a polycrystalline semiconductor layer grow on the partial insulating layer 12a (112a) and a single-crystal Si layer grow on the single-crystal Si layer 13a (113a) as the underlying layer, as exemplified in FIG. 9B. At this time, the single-crystal Si layer 13 (113) grows not on the surface of the single-crystal Si substrate 11 (111) but on that of the single-crystal Si layer 13a (113a) as the underlying layer. For this reason, no reduction problem as described with reference to FIGS. 7 and 8 occurs, and a non-SOI or thick-SOI region which can effectively be used is ensured.

Intrusion of the single-crystal Si layer 13 (113) into the partial insulating layer 12a (112a) causes no particular problems. This is because a portion on the partial insulating layer in the first substrate is to be arranged under a partial buried insulating film in a final partial SOI substrate (or an SOI substrate with a thick-SOI region), and the intrusion does not affect the SOI region above the partial insulating layer.

The present invention can ensure the advantages of an SOI substrate for a substrate having a partial insulating layer under a semiconductor layer.

Alternatively, the present invention has as its object to, e.g., improve the quality of a substrate manufactured through a step of bonding two substrates.

As many apparently widely different embodiments of the present invention can be made without departing from the spirit and scope thereof, it is to be understood that the invention is not limited to the specific embodiments thereof except as defined in the appended claims.

What is claimed is:

1. A method for manufacturing a partial SOI substrate, the method comprising:
    a step of forming a first substrate which has a semiconductor region, a partial insulating layer and a semiconductor layer, the semiconductor region including first and second regions, the partial insulating layer being arranged on the first region so as to be in contact with the first region, and the semiconductor layer being arranged on the second region and the partial insulating layer;
    a step of implanting ions into the first substrate through a surface of the first substrate to form a separation layer at a position deeper than a position of the partial insulating layer;
    a step of bonding a second substrate to the surface of the first substrate, in which the separation layer is formed, to form a bonded substrate stack; and
    a step of splitting the bonded substrate stack at the separation layer to form a partial SOI substrate including an SOI layer comprising the first region arranged on the partial insulating layer so as to be in contact with the partial insulating layer.

2. The method according to claim 1, further comprising a step of planarizing the surface of the first substrate before bonding the second substrate to the first substrate.

3. The method according to claim 1, wherein in the step of forming the first substrate, a single-crystal semiconductor layer is formed on the second region surrounded by the partial insulating layer, and a non-single-crystal semiconductor layer is formed on the partial insulating layer.

4. The method according to claim 1, wherein the semiconductor region comprises a semiconductor layer formed on the substrate by epitaxial growth.

5. The method according to claim 1, wherein at least a surface, to be bonded to the first substrate, of the second substrate comprises an insulator.

6. The method according to claim 1, further comprising a step of forming a bonding layer to be bonded to the second substrate across the surface of the first substrate.

7. The method according to claim 6, further comprising a step of planarizing a surface of the bonding layer after the step of forming the bonding layer and before the step of forming the bonded substrate stack.

8. The method according to claim 6, further comprising a step of planarizing the surface of the first substrate after the step of forming the first substrate and before the step of forming the bonding layer.

9. The method according to claim 6, wherein in the step of forming the bonding layer, a layer having a substantially uniform structure across a surface of the layer is formed as the bonding layer.

10. The method according to claim 6, wherein in the step of forming the bonding layer, a polycrystalline semiconductor layer is formed as the bonding layer.

11. The method according to claim 6, wherein in the step of forming the bonding layer, an amorphous semiconductor layer is formed as the bonding layer.

12. The method according to claim 6, wherein in the step of forming the bonding layer, an insulating layer is formed as the bonding layer.

13. The method according to claim 12, wherein the insulating layer comprises an oxide film.

14. The method according to claim 13, wherein in the step of forming the bonding layer, the oxide film is formed by CVD.

15. The method according to claim 1, wherein the step of forming the first substrate includes:
    a first growth step of growing a single-crystal semiconductor layer on the second region surrounded by the partial insulating layer so that no layer is grown on the partial insulating layer, and
    a second growth step of further growing a single-crystal semiconductor layer on the single-crystal semiconductor layer and growing a non-single-crystal semiconductor layer on the partial insulating layer.

16. The method according to claim 15, wherein in the first growth step, the single-crystal semiconductor layer is grown to have a thickness larger than a thickness of the partial insulating layer.

17. The method according to claim 15, wherein in the first growth step, the single-crystal semiconductor layer is grown such that the non-single-crystal semiconductor layer to be formed in the subsequent second growth step fits in a region on the partial insulating layer.

18. The method according to claim 1, wherein the ions include hydrogen ions or helium ions.

19. A substrate which can be manufactured by a manufacturing method as defined in claim 1.

* * * * *